US012751109B2

(12) United States Patent
Li et al.

(10) Patent No.: US 12,751,109 B2
(45) Date of Patent: Sep. 29, 2026

(54) BACK CONTACT SOLAR CELL AND PHOTOVOLTAIC MODULE

(71) Applicant: LONGI GREEN ENERGY TECHNOLOGY CO., LTD., Xi'an (CN)

(72) Inventors: Zhenguo Li, Xi'an (CN); Hongbo Tong, Xi'an (CN); Yao Chen, Xi'an (CN); Xueliang Zhao, Xi'an (CN); Jiawei Zhao, Xi'an (CN)

(73) Assignee: LONGi Green Energy Technology Co., Ltd., Xi'an (CN)

( * ) Notice: Subject to any disclaimer, the term of this patent is extended or adjusted under 35 U.S.C. 154(b) by 0 days.

(21) Appl. No.: 19/144,809

(22) PCT Filed: Nov. 18, 2024

(86) PCT No.: PCT/CN2024/132724
§ 371 (c)(1),
(2) Date: Jun. 30, 2025

(87) PCT Pub. No.: WO2025/130467
PCT Pub. Date: Jun. 26, 2025

(65) Prior Publication Data

US 2026/0123090 A1 Apr. 30, 2026

(30) Foreign Application Priority Data

Jan. 26, 2024 (CN) ......................... 202410109820.8

(51) Int. Cl.
*H10F 77/14* (2025.01)
*H10F 77/164* (2025.01)
*H10F 77/30* (2025.01)

(52) U.S. Cl.
CPC ....... *H10F 77/147* (2025.01); *H10F 77/1642* (2025.01); *H10F 77/311* (2025.01)

(58) Field of Classification Search
CPC .. H10F 77/141; H10F 77/311; H10F 77/1642; H10F 77/219; H10F 77/14;
(Continued)

(56) References Cited

U.S. PATENT DOCUMENTS

2010/0000597 A1 1/2010 Cousins
2011/0248370 A1 10/2011 Tsoi
(Continued)

FOREIGN PATENT DOCUMENTS

AU 2022353466 A1 4/2024
CN 102623517 A 8/2012
(Continued)

OTHER PUBLICATIONS

CN 116613226A English machine translation (Year: 2023).*
(Continued)

*Primary Examiner* — Andrew J Golden
(74) *Attorney, Agent, or Firm* — Fish & Richardson P.C.

(57) ABSTRACT

This present disclosure provides a back contact solar cell and a photovoltaic module. In one example, a back contact solar cell includes a silicon substrate, a P-type doped polysilicon layer, and an N-type doped polysilicon layer, where the silicon substrate includes a first side and a second side opposite to the first side. The P-type doped polysilicon layer is located in a first region on the first side of the silicon substrate, and the N-type doped polysilicon layer is located in a second region on the first side of the silicon substrate, where the first region is different from the second region. A ratio of a thickness of the P-type doped polysilicon layer to a thickness of the N-type doped polysilicon layer ranges from 1 to 2.

18 Claims, 5 Drawing Sheets

(58) Field of Classification Search
CPC .... H10F 71/121; H10F 10/146; H10F 10/165; H10F 10/166; H10F 19/908
See application file for complete search history.

(56) References Cited

U.S. PATENT DOCUMENTS

| | | | | |
|---|---|---|---|---|
| 2012/0305063 | A1 | 12/2012 | Moslehi et al. | |
| 2013/0147003 | A1* | 6/2013 | Kim | H10F 10/146 257/E31.124 |
| 2015/0013742 | A1* | 1/2015 | Lin | H10F 19/908 136/244 |
| 2018/0190837 | A1 | 7/2018 | Reich et al. | |
| 2019/0189813 | A1 | 6/2019 | Tracy et al. | |
| 2019/0386160 | A1* | 12/2019 | Seno | H10F 77/1223 |
| 2020/0279968 | A1 | 9/2020 | Bende et al. | |
| 2022/0393052 | A1 | 12/2022 | Qiu et al. | |
| 2023/0343881 | A1* | 10/2023 | Xu | H10F 10/165 |
| 2025/0143009 | A1* | 5/2025 | Liu | H10F 10/146 |
| 2025/0194288 | A1* | 6/2025 | Zheng | H10F 77/219 |

FOREIGN PATENT DOCUMENTS

| | | | | |
|---|---|---|---|---|
| CN | 102763226 | A | 10/2012 | |
| CN | 104282774 | A | 1/2015 | |
| CN | 104347751 | A | 2/2015 | |
| CN | 110010719 | A | 7/2019 | |
| CN | 111755552 | A | 10/2020 | |
| CN | 111864008 | A | 10/2020 | |
| CN | 214043686 | U | 8/2021 | |
| CN | 214898462 | U | 11/2021 | |
| CN | 114447161 | A | 5/2022 | |
| CN | 114664954 | A | 6/2022 | |
| CN | 114725248 | A | 7/2022 | |
| CN | 115117180 | A | 9/2022 | |
| CN | 115274869 | A | 11/2022 | |
| CN | 115377232 | A | 11/2022 | |
| CN | 218632057 | U | 3/2023 | |
| CN | 116230783 | A | 6/2023 | |
| CN | 116613226 | A | 8/2023 | |
| CN | 116666468 | A | 8/2023 | |
| CN | 116230783 | B | 10/2023 | |
| CN | 117153908 | A | 12/2023 | |
| CN | 117219693 | A | 12/2023 | |
| CN | 117334760 | A | 1/2024 | |
| CN | 117374169 | A | 1/2024 | |
| CN | 117393624 | A * | 1/2024 | H10F 19/908 |
| CN | 117410359 | A | 1/2024 | |
| CN | 117637892 | A | 3/2024 | |
| EP | 4418332 | A1 | 8/2024 | |
| EP | 4462486 | A1 | 11/2024 | |
| JP | 2014-504003 | A | 2/2014 | |
| JP | 2014056918 | A | 3/2014 | |
| JP | 2023-016702 | A | 2/2023 | |
| KR | 20120021964 | A * | 3/2012 | H10F 10/146 |
| KR | 10-2012-0131275 | A | 12/2012 | |
| WO | WO 2015040780 | A1 | 3/2015 | |
| WO | WO 2023045347 | A1 | 3/2023 | |
| WO | WO 2023050823 | A1 | 4/2023 | |
| WO | WO 2023123809 | A1 | 7/2023 | |
| WO | WO 2024000399 | A1 | 1/2024 | |

OTHER PUBLICATIONS

KR-20120021964-A English machine translation (Year: 2012).*
Office Action in Australian Appln. No. 2024264735, mailed on May 5, 2025, 5 pages.
Extended European Search Report in European Appln No. 24213548.1, dated May 22, 2025, 9 pages.
International Search Report and Written Opinion in International Appln. No. PCT/CN2024/132724, mailed on Jan. 27, 2025, 19 pages (with machine translation).
Office Action in Australian Appln. No. 2024264735, dated Dec. 12, 2024, 7 pages.
Office Action in Chinese Appln. No. 202410109820.8, dated Mar. 8, 2024, 20 pages (with machine translation).
Office Action in Japanese Appln. No. 2024-194047, dated Apr. 15, 2025, 12 pages (with machine translation).
Office Action in Japanese Appln. No. 2024-194047, mailed on Dec. 20, 2024, 20 pages (with machine translation).
Supplementary Search Report in Chinese Appln. No. 202410109820.8, dated Mar. 21, 2024, 7 pages (with machine translation).
Office Action in Japanese Appln. No. 2025-129926, mailed on Jun. 12, 2026, 12 pages (with English translation).

* cited by examiner

BACK CONTACT SOLAR CELL AND PHOTOVOLTAIC MODULE

CROSS-REFERENCE TO RELATED APPLICATIONS

This application is a 371 national stage application of PCT Application No. PCT/CN2024/132724, filed on Nov. 18, 2024, which claims priority to Chinese Patent Application No. 202410109820.8, filed on Jan. 26, 2024. The disclosures of the aforementioned applications are hereby incorporated by reference in their entireties.

TECHNICAL FIELD

This application relates to the field of photovoltaic technologies, and in particular, to a back contact solar cell and a photovoltaic module.

BACKGROUND

A most important characteristic of a back contact (BC) solar cell is that: emitters and metal contacts are arranged on a back surface of the solar cell and no metal electrode is arranged on a front surface of the solar cell. Therefore, the back contact solar cell has a higher short-circuit current Jsc, and the back surface can allow for use of wide metal grid lines to reduce the series resistance Rs, thereby improving a fill factor (FF). In addition, such solar cells with no metal electrode on the front surface have high conversion efficiency, are more aesthetic, and make it easier to assemble a photovoltaic module with all-back electrodes. Therefore, such solar cells have a wide development prospect. For example, an interdigitated back contact (IBC) solar cell among BC solar cells is one of technical directions for realizing efficient crystalline silicon solar cells at present.

However, in existing back contact solar cells, cooperation and optimization between P-type region and N-type region structures are not fully considered to reduce a loss and ensure a passivation effect. As a result, the existing back contact solar cells have poor performance.

SUMMARY

This application provides a back contact solar cell and a photovoltaic module, and aims to resolve the problem of poor performance of existing back contact solar cells.

According to a first aspect of this application, a back contact solar cell is provided, including:

- a silicon substrate, including a first side and a second side opposite to the first side;
- a P-type doped polysilicon layer, located in a first region on the first side of the silicon substrate; and
- an N-type doped polysilicon layer, located in a second region on the first side of the silicon substrate, where the first region is different from the second region; and
- a ratio of a thickness of the P-type doped polysilicon layer to a thickness of the N-type doped polysilicon layer ranges from 1 to 2.

In this embodiment of this application, the P-type doped polysilicon layer has a relatively large thickness, so that a passivation effect of the P-type doped polysilicon layer can be improved, and small metallization damage and small contact resistance can be ensured. In a case that the thickness of the P-type doped polysilicon layer is slightly greater than the thickness of the N-type doped polysilicon layer, corresponding thicknesses may be set for the P-type doped polysilicon layer and the N-type doped polysilicon layer according to their corresponding doping concentrations, passivation effects, and the like. Therefore, not only an optimal passivation effect and an optimal doping concentration can be achieved, but also materials can be saved.

Optionally, a surface of the P-type doped polysilicon layer proximate to the silicon substrate is farther away from the second side of the silicon substrate than a surface of the N-type doped polysilicon layer facing away from the silicon substrate is; and a height difference between the surface of the P-type doped polysilicon layer proximate to the silicon substrate and the surface of the N-type doped polysilicon layer facing away from the silicon substrate is greater than 0 and less than or equal to 4.85 micrometers; or

- a surface of the P-type doped polysilicon layer proximate to the silicon substrate and a surface of the N-type doped polysilicon layer facing away from the silicon substrate are distributed flush with each other; or
- a surface of the P-type doped polysilicon layer proximate to the silicon substrate is closer to the second side of the silicon substrate than a surface of the N-type doped polysilicon layer facing away from the silicon substrate is; and a height difference between the surface of the P-type doped polysilicon layer proximate to the silicon substrate and the surface of the N-type doped polysilicon layer facing away from the silicon substrate is greater than 0 and less than or equal to 0.3 micrometers.

Optionally, the surface of the P-type doped polysilicon layer proximate to the silicon substrate is farther away from the second side of the silicon substrate than the surface of the N-type doped polysilicon layer facing away from the silicon substrate is; and the height difference between the surface of the P-type doped polysilicon layer proximate to the silicon substrate and the surface of the N-type doped polysilicon layer facing away from the silicon substrate is greater than 0 and less than or equal to 1.6 micrometers.

Optionally, the back contact solar cell further includes:

- a first dielectric layer, located between the P-type doped polysilicon layer and the first region on the first side of the silicon substrate.

Optionally, a surface of the first dielectric layer proximate to the silicon substrate is farther away from the second side of the silicon substrate than a surface of the N-type doped polysilicon layer facing away from the silicon substrate is; and a height difference between the surface of the first dielectric layer proximate to the silicon substrate and the surface of the N-type doped polysilicon layer facing away from the silicon substrate is greater than 0 and less than or equal to 4.85 micrometers; or

- a surface of the first dielectric layer proximate to the silicon substrate and a surface of the N-type doped polysilicon layer facing away from the silicon substrate are distributed flush with each other; or
- a surface of the first dielectric layer proximate to the silicon substrate is closer to the second side of the silicon substrate than a surface of the N-type doped polysilicon layer facing away from the silicon substrate is; and a height difference between the surface of the first dielectric layer proximate to the silicon substrate and the surface of the N-type doped polysilicon layer facing away from the silicon substrate is greater than 0 and less than or equal to 0.3 micrometers.

Optionally, the surface of the first dielectric layer proximate to the silicon substrate is farther away from the second side of the silicon substrate than the surface of the N-type doped polysilicon layer facing away from the silicon substrate is; and the height difference between the surface of the first dielectric layer proximate to the silicon substrate and the surface of the N-type doped polysilicon layer facing away from the silicon substrate is greater than 0 and less than or equal to 1.6 micrometers.

Optionally, the silicon substrate is N-type doped; the P-type doped polysilicon layer includes a plurality of P-type collector regions; and the N-type doped polysilicon layer includes a plurality of N-type collector regions, where the N-type collector regions and the P-type collector regions are alternately distributed along a first direction and extend along a second direction; a ratio of a width of an N-type collector region to a width of a P-type collector region ranges from 0.5 to 1.5; and a direction of the width of an N-type collector region and a direction of the width of a P-type collector region are both parallel to the first direction.

Optionally, the silicon substrate is N-type doped; the P-type doped polysilicon layer includes a plurality of P-type collector regions; and the N-type doped polysilicon layer includes a plurality of N-type collector regions, where the N-type collector regions and the P-type collector regions are alternately distributed along a first direction and extend along a second direction; and a ratio of a volume of a P-type collector region to a volume of an N-type collector region ranges from 0.5 to 4.

Optionally, the silicon substrate is P-type doped; the P-type doped polysilicon layer includes a plurality of P-type collector regions; and the N-type doped polysilicon layer includes a plurality of N-type collector regions, where the N-type collector regions and the P-type collector regions are alternately distributed along a first direction and extend along a second direction; and a volume of a P-type collector region is smaller than a volume of an N-type collector region.

Optionally, a ratio of the volume of a P-type collector region to the volume of an N-type collector region ranges from 0.1 to 0.8.

Optionally, the silicon substrate is P-type doped; the P-type doped polysilicon layer includes a plurality of P-type collector regions; and the N-type doped polysilicon layer includes a plurality of N-type collector regions, where the N-type collector regions and the P-type collector regions are alternately distributed along a first direction and extend along a second direction; a width of an N-type collector region is greater than a width of a P-type collector region; and a direction of the width of an N-type collector region and a direction of the width of a P-type collector region are both parallel to the first direction.

Optionally, a ratio of the width of an N-type collector region to the width of a P-type collector region ranges from 2.5 to 8.

Optionally, the P-type doped polysilicon layer further includes a plurality of P-type bus regions; and the N-type doped polysilicon layer further includes a plurality of N-type bus regions, where the N-type bus regions and the P-type bus regions are alternately distributed along the second direction and extend along the first direction; the first direction is different from the second direction, and both the first direction and the second direction are perpendicular to a thickness direction; each N-type collector region located between one N-type bus region and one P-type bus region adjacent to the N-type bus region is connected to the N-type bus region; each P-type collector region located between one N-type bus region and one P-type bus region adjacent to the N-type bus region is connected to the P-type bus region; and a ratio of a length of a collector region to a width of a bus region ranges from 22 to 64, where the collector region is one of the P-type collector regions or the N-type collector regions; the bus region is one of the P-type bus regions or the N-type bus regions; and a direction of the length of a collector region and a direction of the width of a bus region are both parallel to the second direction.

Optionally, the P-type doped polysilicon layer includes a plurality of P-type collector regions and a plurality of P-type bus regions; and

- the N-type doped polysilicon layer includes a plurality of N-type collector regions and a plurality of N-type bus regions, where
- the N-type collector regions and the P-type collector regions are alternately distributed along a first direction and extend along a second direction; and the N-type bus regions and the P-type bus regions are alternately distributed along the second direction and extend along the first direction, where the first direction is different from the second direction, and both the first direction and the second direction are perpendicular to a thickness direction;
- each N-type collector region located between one N-type bus region and one P-type bus region adjacent to the N-type bus region is connected to the N-type bus region;
- each P-type collector region located between one N-type bus region and one P-type bus region adjacent to the N-type bus region is connected to the P-type bus region; and
- a ratio of a length of a collector region to a width of a bus region ranges from 22 to 64, where the collector region is one of the P-type collector regions or the N-type collector regions; the bus region is one of the P-type bus regions or the N-type bus regions; and a direction of the length of a collector region and a direction of the width of a bus region are both parallel to the second direction.

A first gap exists between an N-type collector region and a P-type collector region adjacent to the N-type collector region;

- a second gap exists between a collector region and a bus region of a different type from that of the collector region; and
- a dimension of a second gap in the second direction is greater than or equal to a dimension of a first gap in the first direction.

Optionally, a ratio of the dimension of a second gap in the second direction to the dimension of a first gap in the first direction ranges from 1 to 4.

Optionally, a volume of a P-type bus region is greater than or equal to a volume of an N-type bus region.

Optionally, a ratio of the volume of a P-type bus region to the volume of an N-type bus region ranges from 1 to 2.

Optionally, the silicon substrate is N-type doped;

- a ratio of a width of an N-type collector region to a width of a P-type collector region ranges from 0.5 to 1.5; and a direction of the width of an N-type collector region and a direction of the width of a P-type collector region are both parallel to the first direction.

Optionally, the ratio of the width of an N-type collector region to the width of a P-type collector region ranges from 0.85 to 1.2.

Optionally, the silicon substrate is N-type doped, and a ratio of a volume of a P-type collector region to a volume of an N-type collector region ranges from 0.5 to 4.

Optionally, the ratio of the volume of a P-type collector region to the volume of an N-type collector region ranges from 0.8 to 2.4.

Optionally, the silicon substrate is P-type doped, and a volume of a P-type collector region is smaller than a volume of an N-type collector region.

Optionally, a ratio of the volume of a P-type collector region to the volume of an N-type collector region ranges from 0.1 to 0.8.

Optionally, the silicon substrate is P-type doped, and a width of an N-type collector region is greater than a width of a P-type collector region, where a direction of the width of an N-type collector region and a direction of the width of a P-type collector region are both parallel to the first direction.

Optionally, a ratio of the width of an N-type collector region to the width of a P-type collector region ranges from 2.5 to 8.

Optionally, a ratio of a width of a P-type bus region to a width of an N-type bus region ranges from 0.95 to 1.05; or a ratio of a length of a P-type collector region to a length of an N-type collector region ranges from 0.95 to 1.05.

Optionally, the back contact solar cell further includes:

P-type collector grid lines, located on the P-type collector regions;

P-type bus grid lines, located on the P-type bus regions;

N-type collector grid lines, located on the N-type collector regions; and

N-type bus grid lines, located on the N-type bus regions, where each N-type collector grid line located between one N-type bus grid line and one P-type bus grid line adjacent to the N-type bus grid line is electrically connected to the N-type bus grid line, and each P-type collector grid line located between one N-type bus grid line and one P-type bus grid line adjacent to the N-type bus grid line is electrically connected to the P-type bus grid line.

Optionally, a ratio of a length of a collector grid line to a width of a bus grid line ranges from 22 to 64, where the collector grid line is one of the P-type collector grid lines or the N-type collector grid lines; the bus grid line is one of the P-type bus grid lines or the N-type bus grid lines; and a direction of the length of a collector grid line and a direction of the width of a bus grid line are both parallel to the second direction.

According to a second aspect of this application, a photovoltaic module is provided, including one or more back contact solar cells described in any of the foregoing implementations.

The back contact solar cell and the photovoltaic module have same or similar beneficial effects. To avoid repetition, details are not described herein.

BRIEF DESCRIPTION OF THE DRAWINGS

To describe the technical solutions in the embodiments of this application more clearly, the following briefly introduces the accompanying drawings required for describing the embodiments of this application. Apparently, the accompanying drawings in the following description show only some embodiments of this application, and a person of ordinary skill in the art may still derive other accompanying drawings from these accompanying drawings without creative efforts.

DESCRIPTION OF REFERENCE NUMERALS

Figure 1:
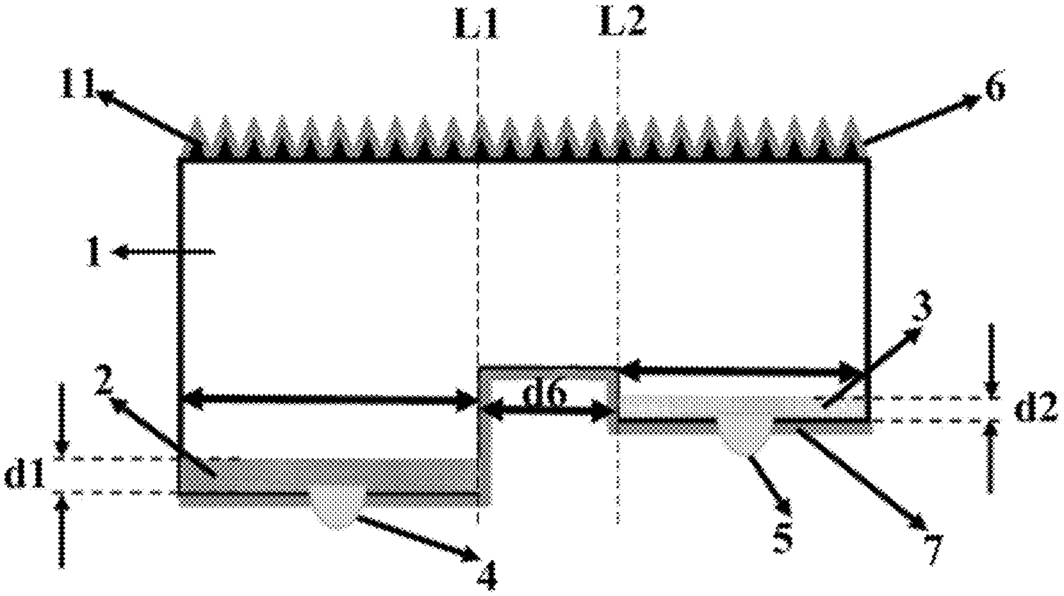
FIG. 1 is a schematic front structural view of a back contact solar cell according to an embodiment of this application.

1—Silicon substrate, 11—Textured structure, 2—P-type doped polysilicon layer, 21—P-type collector region, 22—P-type bus region, 3—N-type doped polysilicon layer, 31—N-type collector region, 32—N-type bus region, 4—Positive electrode, 41—P-type collector grid line, 42—P-type bus grid line, 5—Negative electrode, 51—N-type collector grid line, 52—N-type bus grid line, 6—Front passivation and anti-reflection film layer, 7—Back composite passivation film layer, 8—First dielectric layer, and 9—Second dielectric layer.

d1—Thickness of P-type doped polysilicon layer 2, d2—Thickness of N-type doped polysilicon layer 3, d3—Length of P-type collector region 21, d4—Width of N-type bus region 32, d5—Width of P-type bus region 22, d6—Dimension of first gap in first direction L3, d7—Dimension of second gap in second direction L4, d8—Width of N-type collector region 31, and d9—Width of P-type collector region 21.

DETAILED DESCRIPTION

The following clearly and completely describes the technical solutions in the embodiments of this application with reference to the accompanying drawings in the embodiments of this application. Apparently, the described embodiments are some of the embodiments of this application rather than all of the embodiments. All other embodiments obtained by a person of ordinary skill in the art based on the embodiments in this application without creative efforts shall fall within the protection scope of this application.

In the related art, a main reason for a poor passivation effect in a back contact solar cell is that: due to a process limitation or the like, it is not easy to prepare a P-type doped polysilicon layer with a high concentration. In the related art, the P-type doped polysilicon layer in the back contact solar cell has a relatively small thickness, leading to excessively large metallization damage or excessively large contact resistance of the P-type doped polysilicon layer. For example, a high doping concentration of boron can be hardly achieved due to its relatively small solid solubility. An excessively thin polysilicon layer leads to an increase in metallization damage in P-type regions, and reduces an ablation capability of a metal slurry, further resulting in excessively large contact resistance between metal and silicon and causing an efficiency loss.

Figure 2:
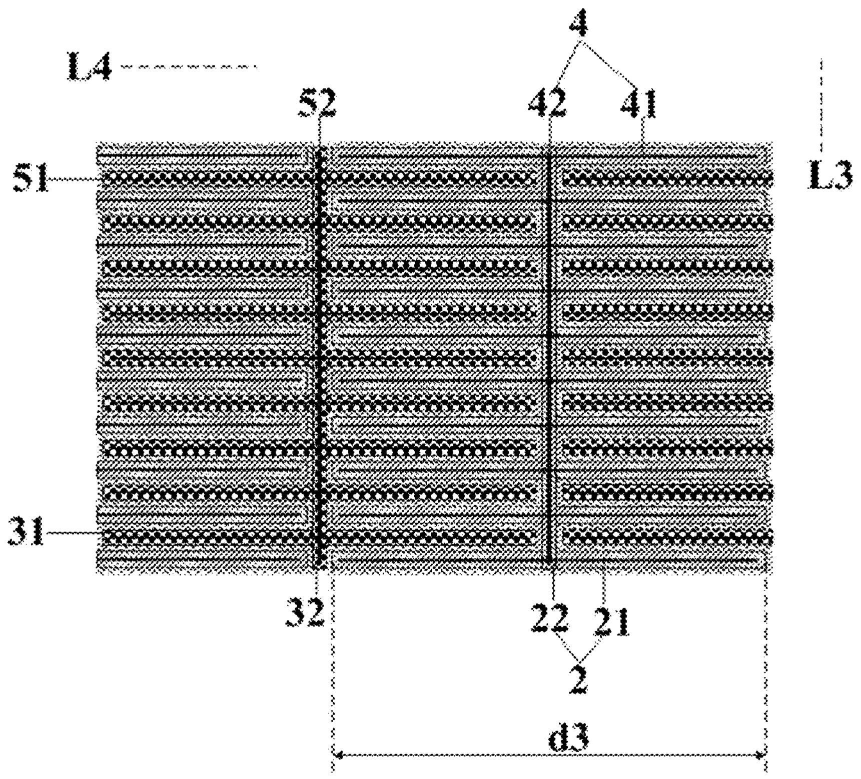
FIG. 2 is a schematic top structural view of a back contact solar cell according to an embodiment of this application.
Figure 3:
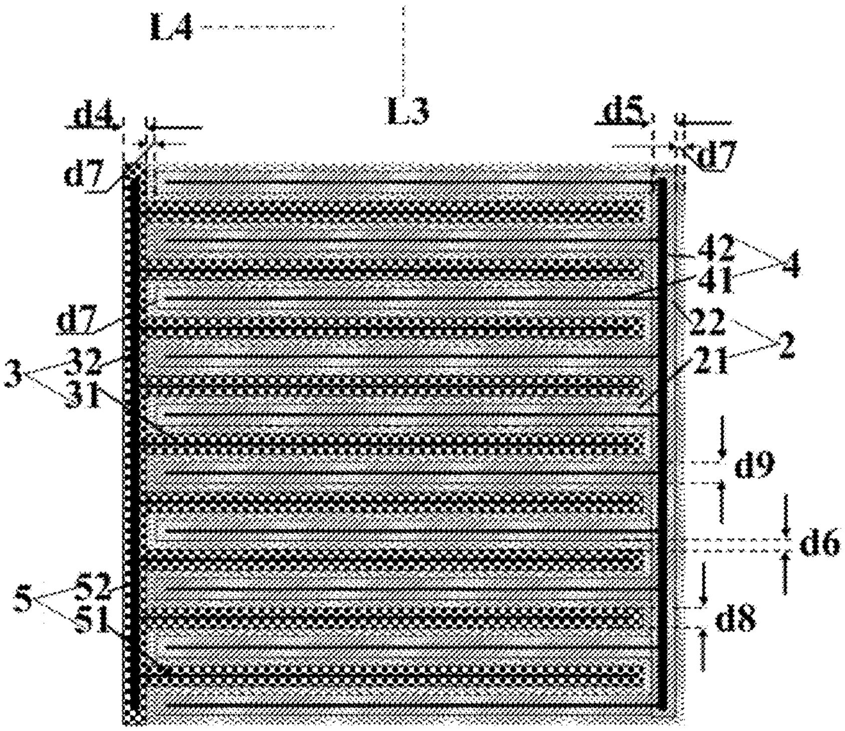
FIG. 3 is a partial schematic top structural view of a back contact solar cell according to an embodiment of this application.
Figure 4:
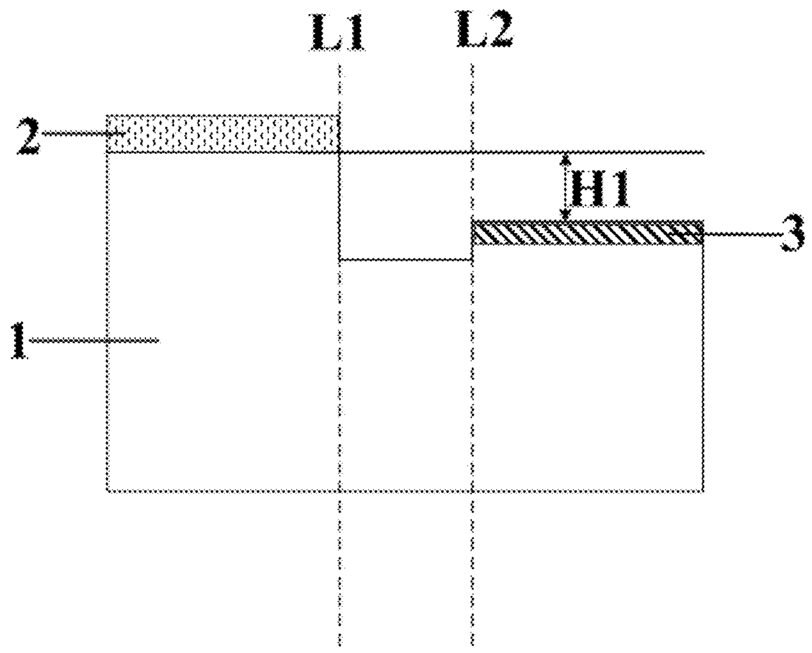
FIG. 4 is a first partial schematic front structural view of a back contact solar cell according to an embodiment of this application.
Figure 5:
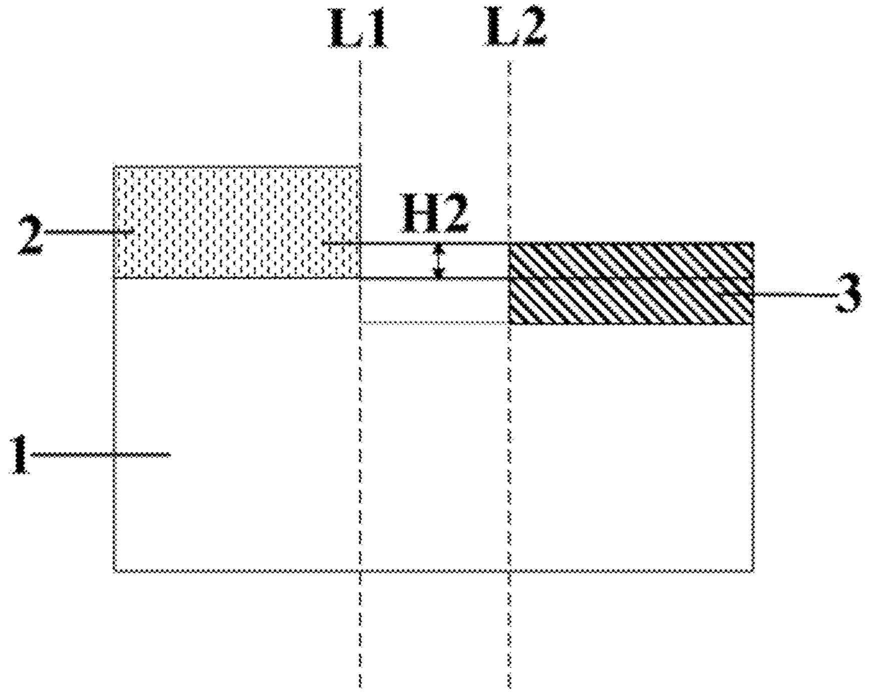
FIG. 5 is a second partial schematic front structural view of a back contact solar cell according to an embodiment of this application.
Figure 6:
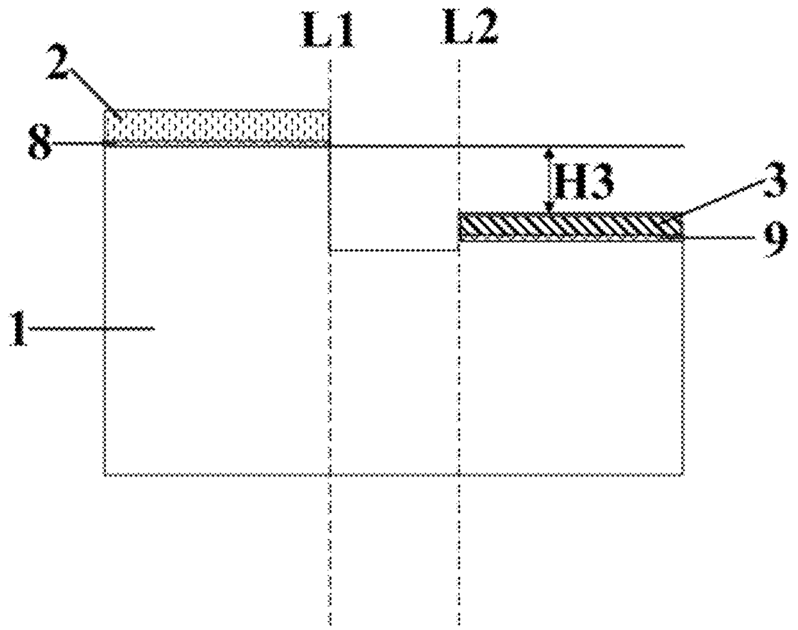
FIG. 6 is a third partial schematic front structural view of a back contact solar cell according to an embodiment of this application.
Figure 7:
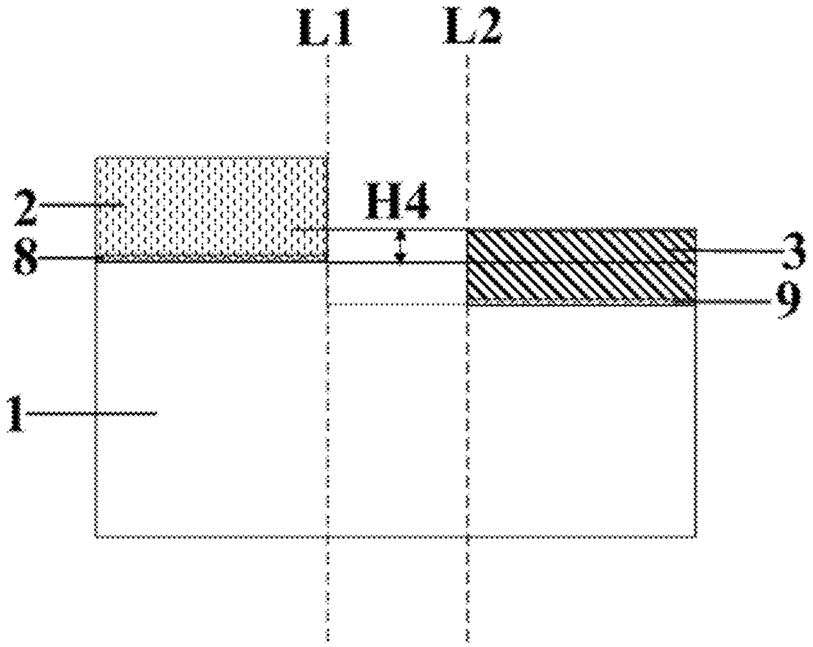
FIG. 7 is a fourth partial schematic front structural view of a back contact solar cell according to an embodiment of this application.

FIG. 1 is a schematic front structural view of a back contact solar cell according to an embodiment of this application. FIG. 2 is a schematic top structural view of a back contact solar cell according to an embodiment of this application. FIG. 3 is a partial schematic top structural view of a back contact solar cell according to an embodiment of this application. FIG. 4 is a first partial schematic front structural view of a back contact solar cell according to an embodiment of this application. FIG. 5 is a second partial schematic front structural view of a back contact solar cell according to an embodiment of this application. FIG. 6 is a third partial schematic front structural view of a back contact solar cell according to an embodiment of this application. FIG. 7 is a fourth partial schematic front structural view of a back contact solar cell according to an embodiment of this application. FIG. 3 is a schematic diagram of a part between two bus grid lines of different types in FIG. 2. It should be noted that, dimension markings in FIG. 1 to FIG. 3 are only for illustrating dimensions and do not represent an actual relative size relationship of the dimensions.

This application provides a back contact solar cell. Referring to FIG. 1, the back contact solar cell may include: a silicon substrate 1, where the silicon substrate 1 includes a first side and a second side opposite to the first side, and the first side is a side close to electrodes. For example, in FIG. 1, the first side of the silicon substrate 1 is a lower side, and the second side is an upper side.

In FIG. 1, a dashed line L1 and a dashed line L2 are only for distinguishing a first region from a second region, and do not actually exist in the back contact solar cell. Referring to FIG. 1, the back contact solar cell further includes a P-type doped polysilicon layer 2, where the P-type doped polysilicon layer 2 is located in the first region on the first side of the silicon substrate 1. On the first side of the silicon substrate 1, a region on a left side of the dashed line L1 is the first region, and a region on a right side of the dashed line L2 is the second region. The P-type doped polysilicon layer 2 is located in the region on the left side of the dashed line L1 on the first side of the silicon substrate 1.

The N-type doped polysilicon layer 3 is located in the second region on the first side of the silicon substrate 1. The first region is different from the second region. As shown in FIG. 1, the N-type doped polysilicon layer 3 is located in the region on the right side of the dashed line L2 on the first side of the silicon substrate 1.

A ratio of a thickness d1 of the P-type doped polysilicon layer 2 to a thickness d2 of the N-type doped polysilicon layer 3 ranges from 1 to 2. In other words, the thickness d1 of the P-type doped polysilicon layer 2 is equal to the thickness d2 of the N-type doped polysilicon layer 3, that is, the ratio of the two thicknesses is equal to 1; or the thickness d1 of the P-type doped polysilicon layer 2 is slightly greater than the thickness d2 of the N-type doped polysilicon layer 3, that is, the ratio of the two thicknesses is greater than 1 and less than or equal to 2, which may be any value in a set (1, 2]. Therefore, in a case that the thickness d1 of the P-type doped polysilicon layer 2 is relatively large, a passivation effect of the P-type doped polysilicon layer 2 can be improved, and small metallization damage and small contact resistance can be ensured. In the case that the thickness d1 of the P-type doped polysilicon layer 2 is slightly greater than the thickness d2 of the N-type doped polysilicon layer 3, corresponding thicknesses may be set for the P-type doped polysilicon layer 2 and the N-type doped polysilicon layer 3 according to their corresponding doping concentrations, passivation effects, and the like. Therefore, not only an optimal passivation effect and an optimal doping concentration can be achieved, but also materials can be saved.

For example, the ratio of the thickness d1 of the P-type doped polysilicon layer 2 to the thickness d2 of the N-type doped polysilicon layer 3 may be 1, 1.01, 1.05, 1.1, 1.15, 1.2, 1.25, 1.3, 1.35, 1.4, 1.45, 1.5, 1.55, 1.6, 1.65, 1.7, 1.75, 1.8, 1.85, 1.9, 1.92, or 2.

It should be noted that, a thickness direction mentioned in this specification is consistent with a direction in which the silicon substrate 1 and the P-type doped polysilicon layer 2 are stacked.

Optionally, in the case that the ratio of d1 to d2 is any value ranging from 1 to 2, the thickness d1 of the P-type doped polysilicon layer 2 ranges from 100 nanometers (nm) to 500 nm, and the thickness d2 of the N-type doped polysilicon layer 3 may range from 50 nm to 300 nm. When d1 and d2 fall within the foregoing ranges, both the P-type doped polysilicon layer 2 and the N-type doped polysilicon layer 3 can easily achieve a good doping effect and a good passivation effect. In addition, small metallization damage and small contact resistance are ensured, and costs are relatively low.

For example, the thickness d1 of the P-type doped polysilicon layer 2 may be 100 nm, 103 nm, 130 nm, 143 nm, 172 nm, 190 nm, 205 nm, 250 nm, 283 nm, 300 nm, 301 nm, 342 nm, 367 nm, 370 nm, 420 nm, 456 nm, 482 nm, or 500 nm. For example, the thickness d2 of the N-type doped polysilicon layer 3 may be 50 nm, 52 nm, 60 nm, 66.7 nm, 73 nm, 81 nm, 90 nm, 92 nm, 100 nm, 112 nm, 133 nm, 144 nm, 175 nm, 190 nm, 211 nm, 243 nm, 270 nm, 282 nm, 296 nm, or 300 nm.

Optionally, the P-type doped polysilicon layer 2 includes a plurality of P-type collector regions 21, and the N-type doped polysilicon layer 3 includes a plurality of N-type collector regions 31. An up-down direction shown by a dashed line L3 is a first direction, and a left-right direction shown by a dashed line L4 is a second direction. The N-type collector regions 31 and the P-type collector regions 21 are alternately distributed along the first direction L3 and extend along the second direction L4. In other words, the N-type collector regions 31 and the P-type collector regions 21 both extend along the second direction L4, and in the first direction L3, the N-type collector regions and the P-type collector regions are alternately distributed in a manner of one N-type collector region 31, one P-type collector region 21, another N-type collector region 31, and another P-type collector region 21. The first direction L3 is different from the second direction L4, and both the first direction and the second direction are perpendicular to the thickness direction. A magnitude of an angle between the first direction L3 and the second direction L4 is not specifically limited. For example, the first direction L3 is perpendicular to the second direction L4.

Optionally, a ratio of a length d3 of a P-type collector region 21 to a length of an N-type collector region 31 ranges from 0.95 to 1.05. The length d3 of a P-type collector region 21 and the length of an N-type collector region 31 are the same or approximately the same, so that a process is simple, this structure is easy to prepare, and a carrier converging effect is good.

For example, the ratio of the length d3 of a P-type collector region 21 to the length of an N-type collector region 31 may be 0.95, 0.951, 0.962, 0.985, 0.99, 0.993, 1.0, 1.01, 1.017, 1.02, 1.028, 1.03, 1.04, 1.047, or 1.05.

Optionally, the silicon substrate 1 is N-type doped, and a ratio of a width d8 of an N-type collector region 31 to a width d9 of a P-type collector region 21 ranges from 0.5 to 1.5, where a direction of the width d8 of an N-type collector region 31 and a direction of the width d9 of a P-type collector region 21 are both parallel to the first direction L3. Specifically, the ratio of the width d8 of an N-type collector region 31 to the width d9 of a P-type collector region 21 ranges from 0.5 to 1.5. Through the setting, a proper junction area proportion can be ensured, ensuring a better current. In addition, passivation in P-type regions and passivation in N-type regions are balanced, ensuring a better open circuit voltage of the solar cell. Therefore, good hole and electron collecting effects can be ensured, thereby improving the efficiency of the solar cell.

For example, the silicon substrate 1 is N-type doped, and the ratio of the width d8 of an N-type collector region 31 to the width d9 of a P-type collector region 21 may be 0.5, 0.53, 0.61, 0.67, 0.7, 0.76, 0.79, 0.85, 0.863, 0.87, 0.89, 0.9, 0.93, 0.97, 1.0, 1.09, 1.15, 1.23, 1.3, 1.46, or 1.5.

Optionally, the silicon substrate 1 is N-type doped, and a ratio of a width d8 of an N-type collector region 31 to a width d9 of a P-type collector region 21 ranges from 0.85 to 1.2, where a direction of the width d8 of an N-type collector region 31 and a direction of the width d9 of a P-type collector region 21 are both parallel to the first direction L3. Specifically, the ratio of the width d8 of an N-type collector region 31 to the width d9 of a P-type collector region 21 ranges from 0.85 to 1.2. Through the setting, a proper junction area proportion can be ensured, ensuring a better current. In addition, passivation in P-type regions and passivation in N-type regions are balanced, ensuring a better open circuit voltage of the solar cell. Therefore, good hole and electron collecting effects can be ensured, thereby improving the efficiency of the solar cell.

For example, the silicon substrate 1 is N-type doped, and the ratio of the width d8 of an N-type collector region 31 to the width d9 of a P-type collector region 21 may be 0.85, 0.859, 0.86, 0.862, 0.868, 0.87, 0.876, 0.88, 0.896, 0.9, 0.92, 0.935, 0.961, 0.973, 0.98, 1.0, 1.06, 1.08, 1.139, 1.15, 1.199, or 1.2.

Optionally, the silicon substrate 1 is N-type doped, the width d8 of an N-type collector region 31 ranges from 380 μm to 500 μm, and the width d9 of a P-type collector region 21 ranges from 300 μm to 450 μm. Through the setting, a proper junction area proportion can be ensured, ensuring a better current. In addition, passivation in P-type regions and passivation in N-type regions are balanced, ensuring a better open circuit voltage of the solar cell. Therefore, good hole and electron collecting effects can be ensured, thereby improving the efficiency of the solar cell.

For example, the silicon substrate 1 is N-type doped, and the width d8 of an N-type collector region 31 may be 380 μm, 387 μm, 394.3 μm, 401 μm, 406 μm, 410 μm, 427 μm, 430 μm, 440 μm, 446.5 μm, 453.1 μm, 466 μm, 472 μm, 479 μm, 483 μm, 493 μm, or 500 μm. For example, the silicon substrate 1 is N-type doped, and the width d9 of a P-type collector region 21 may be 300 μm, 301 μm, 323 μm, 352.1 μm, 363 μm, 369 μm, 375 μm, 379.2 μm, 380 μm, 390 μm, 395.4 μm, 413 μm, 415.1 μm, 420.3 μm, 427.3 μm, 435 μm, 440 μm, 443 μm, or 450 μm.

Optionally, the silicon substrate 1 is N-type doped, and a ratio of a volume of a P-type collector region 21 to a volume of an N-type collector region 31 ranges from 0.5 to 4. Through the setting, a proper junction area proportion can be ensured, ensuring a better current. In addition, passivation in P-type regions and passivation in N-type regions are balanced, so that a passivation effect can be ensured, ensuring a better open circuit voltage of the solar cell, and ensuring small metallization damage and small contact resistance. Therefore, good hole and electron collecting effects can be ensured, thereby improving the efficiency of the solar cell.

For example, the silicon substrate 1 is N-type doped, and the ratio of the volume of a P-type collector region 21 to the volume of an N-type collector region 31 may be 0.5, 0.52, 0.57, 0.61, 0.68, 0.7, 0.79, 0.85, 0.97, 0.985, 1.07, 1.13, 1.25, 1.37, 1.45, 1.57, 1.61, 1.72, 1.83, 1.93, 2.11, 2.27, 2.4, 2.77, 2.885, 2.97, 3, 3.1, 3.37, 3.45, 3.57, 3.61, 3.72, 3.83, 3.93, or 4.

Optionally, the silicon substrate 1 is N-type doped, and a ratio of a volume of a P-type collector region 21 to a volume of an N-type collector region 31 ranges from 0.8 to 2.4. Through the setting, a proper junction area proportion can be ensured, ensuring a better current. In addition, passivation in P-type regions and passivation in N-type regions are balanced, so that a passivation effect can be ensured, ensuring a better open circuit voltage of the solar cell, and ensuring small metallization damage and small contact resistance. Therefore, good hole and electron collecting effects can be ensured, thereby improving the efficiency of the solar cell.

For example, the silicon substrate 1 is N-type doped, and the ratio of the volume of a P-type collector region 21 to the volume of an N-type collector region 31 may be 0.8, 0.82, 0.87, 0.91, 0.93, 0.975, 1.01, 1.16, 1.25, 1.35, 1.45, 1.53, 1.64, 1.72, 1.83, 1.91, 2.11, 2.29, or 2.4.

Optionally, the silicon substrate 1 is P-type doped, and a volume of a P-type collector region 21 is smaller than a volume of an N-type collector region 31. Through the setting, a proper junction area proportion can be ensured, ensuring a better current. In addition, a passivation effect can be improved, ensuring a better open circuit voltage of the solar cell, and ensuring small metallization damage and small contact resistance. Therefore, good hole and electron collecting effects can be ensured, thereby improving the efficiency of the solar cell.

Optionally, the silicon substrate 1 is P-type doped, and a ratio of a volume of a P-type collector region 21 to a volume of an N-type collector region 31 ranges from 0.1 to 0.8. In this case, electrons collected by the N-type collector region 31 are minority carriers, and the ratio of the two volumes is suitable. Therefore, good hole and electron collecting effects can be ensured, thereby improving the efficiency of the solar cell.

For example, the silicon substrate 1 is P-type doped, and the ratio of the volume of a P-type collector region 21 to the volume of an N-type collector region 31 may be 0.1, 0.17, 0.27, 0.31, 0.38, 0.41, 0.43, 0.45, 0.5, 0.57, 0.63, 0.67, 0.69, 0.72, 0.77, 0.79, or 0.8.

Optionally, the silicon substrate 1 is P-type doped, and a width d8 of an N-type collector region 31 is greater than a width d9 of a P-type collector region 21. In this case, electrons collected by the N-type collector region 31 are minority carriers, and the width d8 of an N-type collector region 31 is relatively large, which is conducive to collection of the minority carriers, thereby improving the efficiency of the back contact solar cell. It should be noted that, a direction of the width d8 of an N-type collector region 31 and a direction of the width d9 of a P-type collector region 21 are both parallel to the first direction L3.

Optionally, the silicon substrate 1 is P-type doped, the ratio of the width d8 of an N-type collector region 31 to the width d9 of a P-type collector region 21 ranges from 2.5 to 8, and the ratio is set to a suitable value. Through the setting, a proper junction area proportion can be ensured, ensuring a better current. In addition, passivation in P-type regions and passivation in N-type regions are balanced, so that a passivation effect can be improved, ensuring a better open circuit voltage of the solar cell. Therefore, good hole and electron collecting effects can be ensured, thereby improving the efficiency of the solar cell.

For example, the silicon substrate 1 is P-type doped, and the ratio of the width d8 of an N-type collector region 31 to the width d9 of a P-type collector region 21 may be 2.5, 2.69, 2.72, 2.89, 2.93, 3.1, 3.3, 3.89, 4.0, 4.56, 4.99, 5.15, 5.25, 5.5, 6.64, 6.87, 7.32, 7.59, or 8.

Optionally, the silicon substrate 1 is P-type doped, the width d8 of an N-type collector region 31 ranges from 500 μm to 800 μm, and the width d9 of a P-type collector region 21 ranges from 100 μm to 200 μm. Through the setting, a proper junction area proportion can be ensured, ensuring a better current. In addition, passivation in P-type regions and passivation in N-type regions are balanced, so that a passivation effect can be improved, ensuring a better open circuit voltage of the solar cell. Therefore, good hole and electron collecting effects can be ensured, thereby improving the efficiency of the solar cell.

For example, the silicon substrate 1 is P-type doped, and the width d8 of an N-type collector region 31 may be 500 μm, 522 μm, 531.3 μm, 541.3 μm, 588 μm, 601 μm, 623 μm, 647 μm, 650 μm, 666 μm, 683.1 μm, 672 μm, 694 μm, 713 μm, 756 μm, 783.2 μm, or 800 μm. For example, the silicon substrate 1 is P-type doped, and the width d9 of a P-type collector region 21 may be 100 μm, 101 μm, 111.3 μm, 125 μm, 133 μm, 146 μm, 150 μm, 158.7 μm, 161 μm, 169 μm, 173 μm, 180.3 μm, 187.7 μm, 191 μm, 193 μm, 199.7 μm, or 200 μm.

Optionally, referring to FIG. 2 and FIG. 3, the P-type doped polysilicon layer 2 includes a plurality of P-type collector regions 21 and a plurality of P-type bus regions 22; and the N-type doped polysilicon layer 3 includes a plurality of N-type collector regions 31 and a plurality of N-type bus regions 32. In FIG. 2 and FIG. 3, an up-down direction shown by a dashed line L3 is a first direction, and a left-right direction shown by a dashed line L4 is a second direction. The N-type collector regions 31 and the P-type collector regions 21 are alternately distributed along the first direction L3 and extend along the second direction L4. In other words, the N-type collector regions 31 and the P-type collector regions 21 both extend along the second direction L4, and in the first direction L3, the N-type collector regions and the P-type collector regions are alternately distributed in a manner of one N-type collector region 31, one P-type collector region 21, another N-type collector region 31, and another P-type collector region 21. As shown in FIG. 2, the length of a P-type collector region 21 is d3, and generally, the length d3 of a P-type collector region 21 and the length of an N-type collector region 31 are the same or approximately the same. In a case that bus regions exist, a P-type bus region 22 is approximately located at a center position of a corresponding P-type collector region 21 in the first direction L3, and an N-type bus region 32 is approximately located at a center position of a corresponding N-type collector region 31 in the first direction L3. Generally, projections of an N-type collector region 31 and a P-type collector region 21 adjacent to the N-type collector region in the first direction L3 at least partially overlap with each other. In addition, a length of a P-type bus region 22 and a length of an N-type bus region 32 are the same or approximately the same, and projections of a P-type bus region 22 and an N-type bus region 32 adjacent to the P-type bus region in the second direction L4 at least partially overlap with each other or approximately overlap with each other. It should be noted that, the first direction L3 is different from the second direction L4, and both the first direction and the second direction are perpendicular to the thickness direction. A magnitude of an angle between the first direction L3 and the second direction L4 is not specifically limited. For example, in FIG. 2 and FIG. 3, the first direction L3 is perpendicular to the second direction L4.

The N-type bus regions 32 and the P-type bus regions 22 are alternately distributed along the second direction L4 and extend along the first direction L3. In other words, the N-type bus regions 32 and the P-type bus regions 22 both extend along the first direction L3, and in the second direction L4, the N-type bus regions and the P-type bus regions are alternately distributed in a manner of one N-type bus region 32, one P-type bus region 22, another N-type bus region 32, and another P-type bus region 22.

Referring to FIG. 3, each N-type collector region 31 located between one N-type bus region 32 and one P-type bus region 22 adjacent to the N-type bus region is connected to the N-type bus region 32, and each P-type collector region 21 located between one N-type bus region 32 and one P-type bus region 22 adjacent to the N-type bus region is connected to the P-type bus region 22. A back contact solar cell formed in this manner is an IBC solar cell.

The P-type collector regions 21 and the N-type collector regions 31 herein are collectively referred to as collector regions. The N-type bus regions 32 and the P-type bus regions 22 herein are collectively referred to as bus regions. A ratio of a length of a collector region to a width of a bus region ranges from 22 to 64, where a direction of the length of a collector region and a direction of the width of a bus region are both parallel to the second direction L4. Generally, a length d3 of a P-type collector region 21 and a length of an N-type collector region 31 are the same or approximately the same, and a width d4 of an N-type bus region 32 and a width d5 of a P-type bus region 22 are the same or approximately the same. Therefore, that the ratio of the length of a collector region to the width of a bus region ranges from 22 to 64 corresponds to four cases. In the first case, a ratio of the length d3 of a P-type collector region 21 to the width d5 of a P-type bus region 22 ranges from 22 to 64. In the second case, a ratio of the length of an N-type collector region 31 to the width d5 of a P-type bus region 22 ranges from 22 to 64. In the third case, a ratio of the length d3 of a P-type collector region 21 to the width d4 of an N-type bus region 32 ranges from 22 to 64. In the fourth case, a ratio of the length of an N-type collector region 31 to the width d4 of an N-type bus region 32 ranges from 22 to 64. When the ratio of the length of a collector region to the width of a bus region is excessively small, an efficiency loss of the solar cell may be caused; and when the ratio is excessively large, series resistance of the solar cell may be increased. When the ratio of the length of a collector region to the width of a bus region ranges from 22 to 64, a magnitude of the ratio is suitable, so that better performance of the solar cell can be ensured, and a waste of resources can be avoided.

For example, the ratio of the length of a collector region to the width of a bus region may be 22, 22.4, 27, 29, 31.2, 33, 36, 38, 40, 45.4, 48.7, 51.2, 53.7, 57.3, 60, 62.4, or 64.

Optionally, a ratio of the width d5 of a P-type bus region 22 to the width d4 of an N-type bus region 32 ranges from 0.95 to 1.05. The width d5 of a P-type bus region 22 and the width d4 of an N-type bus region 32 are the same or approximately the same, so that a process is simple, this structure is easy to prepare, and a carrier converging effect is good.

For example, the ratio of the width d5 of a P-type bus region 22 to the width d4 of an N-type bus region 32 may be 0.95, 0.96, 0.968, 0.977, 0.986, 0.99, 0.993, 1.0, 1.01, 1.016, 1.02, 1.03, 1.04, 1.043, or 1.05.

Optionally, the width d5 of a P-type bus region 22 ranges from 300 micrometers (μm) to 800 μm, and the width d4 of an N-type bus region 32 ranges from 300 μm to 800 μm, so that both the P-type bus regions and the N-type bus regions have a good carrier converging effect, and a waste of resources can be avoided.

For example, the width d5 of a P-type bus region 22 may be 300 μm, 312 μm, 343 μm, 350 μm, 362 μm, 391 μm, 410 μm, 442 μm, 467 μm, 492 μm, 500 μm, 532 μm, 550 μm, 589.2 μm, 632.3 μm, 662 μm, 711 μm, 753.2 μm, 763 μm, 788 μm, or 800 μm. For example, the width d4 of an N-type bus region 32 may be 300 μm, 333 μm, 351 μm, 360.1 μm, 374 μm, 391 μm, 423 μm, 451 μm, 499 μm, 513 μm, 531 μm, 550 μm, 591 μm, 625 μm, 678.1 μm, 743 μm, 762.1 μm, 777 μm, or 800 μm.

Optionally, a volume of a P-type bus region 22 is greater than or equal to a volume of an N-type bus region 32, and the P-type bus region 22 has a relatively large volume, so that a passivation effect of the P-type bus region 22 can be improved, and small metallization damage and small contact resistance can be ensured.

Optionally, a ratio of the volume of a P-type bus region 22 to the volume of an N-type bus region 32 ranges from 1 to 2. Specifically, a length of a P-type bus region 22 and a length of an N-type bus region 32 are approximately the same, the width d5 of a P-type bus region 22 and the width d4 of an N-type bus region 32 are approximately the same, and a ratio of a thickness of the P-type bus region 22 to a thickness of the N-type bus region 32 ranges from 1 to 2, so that the ratio of the volume of a P-type bus region 22 to the volume of an N-type bus region 32 ranges from 1 to 2. The two volumes are the same, that is, the ratio of the two volumes is equal to 1; or the volume of a P-type bus region 22 is slightly greater than the volume of an N-type bus region 32, that is, the ratio of the two volumes is greater than 1 and less than or equal to 2, which may be any value in a set (1, 2]. Therefore, in a case that the P-type bus region 22 has a relatively large volume, a passivation effect of the P-type bus region 22 can be improved, and small metallization damage and small contact resistance can be ensured. In the case that the volume of a P-type bus region 22 is slightly greater than the volume of an N-type bus region 32, corresponding thicknesses may be set for the P-type bus region 22 and the N-type bus region 32 according to their corresponding doping concentrations, passivation effects, and the like. Therefore, not only an optimal passivation effect and an optimal doping concentration can be achieved, but also materials can be saved.

For example, the ratio of the volume of a P-type bus region 22 to the volume of an N-type bus region 32 may be 1, 1.01, 1.1, 1.21, 1.32, 1.37, 1.44, 1.46, 1.5, 1.58, 1.63, 1.71, 1.79, 1.8, 1.86, 1.92, 1.96, or 2.

Optionally, a first gap exists between an N-type collector region 31 and a P-type collector region 21 adjacent to the N-type collector region, and a dimension of the first gap in the first direction L3 is d6. A second gap exists between a collector region and a bus region of a different type from that of the collector region, and a dimension of the second gap in the second direction L4 is d7. The P-type collector regions 21 and the N-type collector regions 31 herein are collectively referred to as collector regions. The N-type bus regions 32 and the P-type bus regions 22 herein are collectively referred to as bus regions. In other words, a second gap exists between a P-type collector region 21 and an N-type bus region 32; and a second gap exists between an N-type collector region 31 and a P-type bus region 22. The dimension d7 of a second gap in the second direction L4 is greater than or equal to the dimension d6 of a first gap in the first direction L3. Specifically, a current flowing through the bus region is generally large, and when the dimension d7 of the second gap between a collector region and a bus region of a different type from that of the collector region in the second direction L4 is greater than or equal to the dimension d6 of the first gap between an N-type collector region 31 and a P-type collector region 21 adjacent to the N-type collector region in the first direction L3, a short-circuit probability is lower, thereby keeping a high yield and high reliability.

Optionally, a ratio of the dimension d7 of a second gap in the second direction L4 to the dimension d6 of a first gap in the first direction L3 ranges from 1 to 4. When a range of the ratio is excessively large, a waste of space may be caused, and when the range of the ratio is excessively small, a short-circuit risk may be caused. When the ratio ranges from 1 to 4, the range of the ratio is suitable, so that a short-circuit probability is low, and a waste of space can be basically avoided.

For example, the ratio of the dimension d7 of a second gap in the second direction L4 to the dimension d6 of a first gap in the first direction L3 may be 1, or the ratio of the two dimensions may be any value in a set (1, 4]. For example, the ratio of the two dimensions may be 1.01, 1.05, 1.09, 1.095, 1.1, 1.12, 1.143, 1.16, 1.17, 1.19, 1.20, 1.24, 1.28, 1.3, 1.32, 1.329, 1.34, 1.45, 1.62, 1.95, 2.1, 2.32, 2.66, 2.93, 3.16, 3.57, 3.71, 3.89, or 4.

Optionally, the dimension d6 of a first gap in the first direction L3 ranges from 50 μm to 150 μm, and the dimension d7 of a second gap in the second direction L4 ranges from 50 μm to 200 μm. Through the foregoing setting of the two gaps, a short-circuit probability can be reduced, and a waste of space can be basically avoided.

For example, the dimension d6 of a first gap in the first direction L3 may be 50 μm, 58 μm, 69 μm, 72 μm, 78 μm, 81 μm, 86 μm, 93 μm, 97.2 μm, 99 μm, 100 μm, 100.3 μm, 102 μm, 105.7 μm, 109.2 μm, 111 μm, 117 μm, 123 μm, 130 μm, 142.2 μm, 147.3 μm, or 150 μm. For example, the dimension d7 of a second gap in the second direction L4 may be 50 μm, 53.2 μm, 58 μm, 61 μm, 63 μm, 74 μm, 75.2 μm, 80 μm, 83 μm, 86 μm, 99 μm, 101 μm, 109 μm, 113 μm, 118 μm, 120.3 μm, 125 μm, 131 μm, 137 μm, 143 μm, 155 μm, 161 μm, 177 μm, 185 μm, or 200 μm.

Optionally, the silicon substrate 1 is N-type doped, and a ratio of a width d8 of an N-type collector region 31 to a width d9 of a P-type collector region 21 ranges from 0.5 to 1.5, where a direction of the width d8 of an N-type collector region 31 and a direction of the width d9 of a P-type collector region 21 are both parallel to the first direction L3. For a specific ratio of the width d8 of an N-type collector region 31 to the width d9 of a P-type collector region 21 or specific values of the widths of the collector regions, reference may be made to the foregoing description about the ratio or the values.

Optionally, the silicon substrate 1 is N-type doped, and a ratio of a volume of a P-type collector region 21 to a volume of an N-type collector region 31 ranges from 0.5 to 4. For a specific ratio of the volume of a P-type collector region 21 to the volume of an N-type collector region 31, reference may be made to the foregoing description about the ratio.

Optionally, the silicon substrate 1 is P-type doped, and a volume of a P-type collector region 21 is smaller than a volume of an N-type collector region 31.

Optionally, the silicon substrate 1 is P-type doped, and a ratio of a volume of a P-type collector region 21 to a volume of an N-type collector region 31 ranges from 0.1 to 0.8. For a specific ratio of the volume of a P-type collector region 21 to the volume of an N-type collector region 31, reference may be made to the foregoing description about the ratio.

Optionally, the silicon substrate 1 is P-type doped, and a width d8 of an N-type collector region 31 is greater than a width d9 of a P-type collector region 21.

Optionally, the silicon substrate 1 is N-type doped, and a ratio of a width d8 of an N-type collector region 31 to a width d9 of a P-type collector region 21 ranges from 2.5 to 8. For a specific ratio of the width d8 of an N-type collector region 31 to the width d9 of a P-type collector region 21 or specific values of the widths of the collector regions, reference may be made to the foregoing description about the ratio or the values.

Optionally, referring to FIG. 2 and FIG. 3, the back contact solar cell further includes: P-type collector grid lines 41 and P-type bus grid lines 42, where the P-type collector grid lines 41 are located on the P-type collector regions 21, the P-type bus grid lines 42 are located on the P-type bus regions 22, the P-type collector grid lines 41 are configured to collect holes of the P-type collector regions 21, and the P-type bus grid lines 42 and the P-type collector grid lines 41 form positive electrodes 4; and N-type collector grid lines 51 and N-type bus grid lines 52, where the N-type collector grid lines 51 are located on the N-type collector regions 31, the N-type bus grid lines 52 which are located on the N-type bus regions 32, the N-type collector grid lines 51 are configured to collect electrons of the N-type collector regions 31, and the N-type bus grid lines 52 and the N-type collector grid lines 51 form negative electrodes 5. Each N-type collector grid line 51 located between one N-type bus grid line 52 and one P-type bus grid line 42 adjacent to the N-type bus grid line is electrically connected to the N-type bus grid line 52, and the N-type bus grid line 52 is configured to conduct electrons from each N-type collector grid line 51 electrically connected to the N-type bus grid line; and each P-type collector grid line 41 located between one N-type bus grid line and one P-type bus grid line adjacent to the N-type bus grid line is electrically connected to the P-type bus grid line 42, and the P-type bus grid line 42 is configured to conduct holes from each P-type collector grid line 41 electrically connected to the P-type bus grid line. The back contact solar cell is an IBC solar cell, which has high conversion efficiency, is more aesthetic, and makes it easier to assemble the back contact solar cell to form a photovoltaic module.

The P-type collector grid lines 41 and the N-type collector grid lines 51 herein are collectively referred to as collector grid lines. The N-type bus grid lines 52 and the P-type bus grid lines 42 herein are collectively referred to as bus grid lines. A ratio of a length of a collector grid line to a width of a bus grid line ranges from 22 to 64, where a direction of the length of a collector grid line and a direction of the width of a bus grid line are both parallel to the second direction L4. Generally, a length of a P-type collector grid line 41 and a length of an N-type collector grid line 51 are the same or approximately the same, and a width of an N-type bus grid line 52 and a width of a P-type bus grid line 42 are the same or approximately the same. Therefore, that the ratio of the length of a collector grid line to the width of a bus grid line ranges from 22 to 64 corresponds to four cases. In the first case, a ratio of the length of a P-type collector grid line 41 to the width of a P-type bus grid line 42 ranges from 22 to 64. In the second case, a ratio of the length of an N-type collector grid line 51 to the width of a P-type bus grid line 42 ranges from 22 to 64. In the third case, a ratio of the length of a P-type collector grid line 41 to the width of an N-type bus grid line 52 ranges from 22 to 64. In the fourth case, a ratio of the length of an N-type collector grid line 51 to the width of an N-type bus grid line 52 ranges from 22 to 64. When the ratio of the length of a collector grid line to the width of a bus grid line is excessively small, an efficiency loss of the solar cell may be caused; and when the ratio is excessively large, series resistance of the solar cell may be increased. When the ratio of the length of a collector grid line to the width of a bus grid line ranges from 22 to 64, a magnitude of the ratio is suitable, so that better performance of the solar cell can be ensured, and a waste of resources can be avoided.

For example, the ratio of the length of a collector grid line to the width of a bus grid line may be 22, 23.1, 24.7, 27, 28, 29, 30.1, 31.2, 32.7, 33, 33.6, 37, 39.2, 40, 42.7, 44.8, 45.4, 49.1, 51.2, 53.7, 57.3, 58.1, 60, 62.4, 63, or 64.

Optionally, a surface of the second side of the silicon substrate 1 has a textured structure 11, and the textured structure 11 brings a good light trapping effect, thereby improving the conversion efficiency of the back contact solar cell.

Optionally, the back contact solar cell further includes a front passivation and anti-reflection film layer 6 located on the surface of the second side of the silicon substrate 1 and a back composite passivation film layer 7 located on a surface of the P-type doped polysilicon layer 2 and a surface of the N-type doped polysilicon layer 3.

In FIG. 4 to FIG. 7, a dashed line L1 and a dashed line L2 are only for distinguishing a first region from a second region, and do not actually exist in the back contact solar cell. In FIG. 4 to FIG. 7, on the first side of the silicon substrate 1, a region on a left side of the dashed line L1 is the first region, and a region on a right side of the dashed line L2 is the second region. The P-type doped polysilicon layer 2 is located in the region on the left side of the dashed line L1 on the first side of the silicon substrate 1. The N-type doped polysilicon layer 3 is located in the second region on the first side of the silicon substrate 1. The first region is different from the second region. The N-type doped polysilicon layer 3 is located in the region on the right side of the dashed line L2 on the first side of the silicon substrate 1.

Optionally, referring to FIG. 4, a surface of the P-type doped polysilicon layer 2 proximate to the silicon substrate 1 is farther away from the second side of the silicon substrate 1 than a surface of the N-type doped polysilicon layer 3 facing away from the silicon substrate 1 is; and a height difference H1 between the surface of the P-type doped polysilicon layer 2 proximate to the silicon substrate 1 and the surface of the N-type doped polysilicon layer 3 facing away from the silicon substrate 1 is greater than 0 and less than or equal to 4.85 micrometers (μm). Optionally, a surface of the P-type doped polysilicon layer 2 proximate to the silicon substrate 1 and a surface of the N-type doped polysilicon layer 3 facing away from the silicon substrate 1 are distributed flush with each other. The flush herein is that: a height difference between the surface of the P-type doped polysilicon layer 2 proximate to the silicon substrate 1 and the surface of the N-type doped polysilicon layer 3 facing away from the silicon substrate 1 is 0. Optionally, referring to FIG. 5, a surface of the P-type doped polysilicon layer 2 proximate to the silicon substrate 1 is closer to the second side of the silicon substrate 1 than a surface of the N-type doped polysilicon layer 3 facing away from the silicon substrate 1 is; and a height difference H2 between the surface of the P-type doped polysilicon layer 2 proximate to the silicon substrate 1 and the surface of the N-type doped polysilicon layer 3 facing away from the silicon substrate 1 is greater than 0 and less than or equal to 0.3 micrometers.

When a relative position relationship between the surface of the P-type doped polysilicon layer 2 proximate to the silicon substrate 1 and the surface of the N-type doped polysilicon layer 3 facing away from the silicon substrate 1 is one of the foregoing three cases, the following beneficial technical effects can be achieved: for the P-type doped polysilicon layer 2 and the N-type doped polysilicon layer 3, when a latter doped polysilicon layer is prepared, the former prepared doped polysilicon layer may be used as a position reference, facilitating control over a thickness of the latter doped polysilicon layer and reducing process difficulty; before the latter doped polysilicon layer is prepared, a part that needs to be etched in the former prepared doped polysilicon layer is etched cleanly, and the P-type doped polysilicon layer 2 and the N-type doped polysilicon layer 3 in a gap between the first region and the second region are both etched cleanly, thereby bringing good electrical performance, a good electrical isolation effect, and a low short-circuit or current leakage risk; and the silicon substrate 1 is not over-etched, and the back contact solar cell is not easily cracked, so that mechanical performance is good.

For example, referring to FIG. 4 and FIG. 5, the surface of the P-type doped polysilicon layer 2 proximate to the silicon substrate 1 is a lower surface of the P-type doped polysilicon layer 2, and the surface of the N-type doped polysilicon layer 3 facing away from the silicon substrate 1 is an upper surface of the N-type doped polysilicon layer 3. The second side of the silicon substrate 1 is a lower side of the silicon substrate 1. In FIG. 4, the lower surface of the P-type doped polysilicon layer 2 is higher than the upper surface of the N-type doped polysilicon layer 3, that is, the surface of the P-type doped polysilicon layer 2 proximate to the silicon substrate 1 is farther away from the second side of the silicon substrate 1 than the surface of the N-type doped polysilicon layer 3 facing away from the silicon substrate 1 is. In FIG. 4, the height difference H1 between the lower surface of the P-type doped polysilicon layer 2 and the upper surface of the N-type doped polysilicon layer 3 may be any value in a set (0, 4.85 μm]. For example, in FIG. 4, the height difference H1 between the lower surface of the P-type doped polysilicon layer 2 and the upper surface of the N-type doped polysilicon layer 3 may be 0.02 μm, 0.05 μm, 0.08 μm, 0.1 μm, 0.42 μm, 0.92 μm, 1.02 μm, 1.46 μm, 1.57 μm, 1.83 μm, 1.95 μm, 2.03 μm, 2.21 μm, 2.37 μm, 2.42 μm, 2.64 μm, 2.97 μm, 3.11 μm, 3.53 μm, 3.69 μm, 3.92 μm, 4.07 μm, 4.26 μm, 4.37 μm, 4.62 μm, or 4.85 μm.

In FIG. 5, the lower surface of the P-type doped polysilicon layer 2 is lower than the upper surface of the N-type doped polysilicon layer 3, that is, the surface of the P-type doped polysilicon layer 2 proximate to the silicon substrate 1 is closer to the second side of the silicon substrate 1 than the surface of the N-type doped polysilicon layer 3 facing away from the silicon substrate 1 is. In FIG. 5, the height difference H2 between the lower surface of the P-type doped polysilicon layer 2 and the upper surface of the N-type doped polysilicon layer 3 may be any value in a set (0, 0.3 μm]. For example, in FIG. 5, the height difference H2 between the lower surface of the P-type doped polysilicon layer 2 and the upper surface of the N-type doped polysilicon layer 3 may be 0.01 μm, 0.02 μm, 0.04 μm, 0.07 μm, 0.09 μm, 0.1 μm, 0.12 μm, 0.15 μm, 0.16 μm, 0.17 μm, 0.19 μm, 0.2 μm, 0.21 μm, 0.24 μm, 0.246 μm, 0.251 μm, 0.253 μm, 0.261 μm, 0.273 μm, 0.281 μm, 0.287 μm, 0.290 μm, 0.293 μm, 0.296 μm, or 0.3 μm.

Optionally, referring to FIG. 4, the surface of the P-type doped polysilicon layer 2 proximate to the silicon substrate 1 is farther away from the second side of the silicon substrate 1 than the surface of the N-type doped polysilicon layer 3 facing away from the silicon substrate 1 is; and the height difference H1 between the surface of the P-type doped polysilicon layer 2 proximate to the silicon substrate 1 and the surface of the N-type doped polysilicon layer 3 facing away from the silicon substrate 1 is greater than 0 and less than or equal to 1.6 μm. Through the setting, control over relative positions of the two surfaces is more accurate, a position reference function is more accurate, before the latter doped polysilicon layer is prepared, the part that needs to be etched in the former prepared doped polysilicon layer is etched more cleanly, and the P-type doped polysilicon layer 2 and the N-type doped polysilicon layer 3 in the gap between the first region and the second region are etched more cleanly, thereby bringing better electrical performance, a good electrical isolation effect, and a lower short-circuit or current leakage risk. In addition, the back contact solar cell is less easily cracked, so that mechanical performance is better.

In FIG. 4, the height difference H1 between the lower surface of the P-type doped polysilicon layer 2 and the upper surface of the N-type doped polysilicon layer 3 may be any value in a set (0, 1.6 μm]. For example, in FIG. 4, the height difference H1 between the lower surface of the P-type doped polysilicon layer 2 and the upper surface of the N-type doped polysilicon layer 3 may be 0.02 μm, 0.03 μm, 0.04 μm, 0.05 μm, 0.07 μm, 0.08 μm, 0.1 μm, 0.15 μm, 0.22 μm, 0.34 μm, 0.41 μm, 0.52 μm, 0.63 μm, 0.72 μm, 0.8 μm, 0.95 μm, 1.02 μm, 1.22 μm, 1.34 μm, 1.46 μm, 1.57 μm, or 1.6 μm.

Optionally, referring to FIG. 6 and FIG. 7, the back contact solar cell further includes a first dielectric layer 8, where the first dielectric layer 8 is located between the P-type doped polysilicon layer 2 and the first region on the first side of the silicon substrate 1. Whether the back contact solar cell further includes a second dielectric layer is not specifically limited. For example, in FIG. 6 and FIG. 7, the back contact solar cell further includes a second dielectric layer 9, where the second dielectric layer 9 is located between the N-type doped polysilicon layer 3 and the second region on the first side of the silicon substrate 1. A thickness of the first dielectric layer 8 and a thickness of the second dielectric layer 9 may each range from 1 nm to 2 nm, and a material of the first dielectric layer 8 and a material of the second dielectric layer 9 may each include: silicon oxide, silicon nitride, silicon oxynitride, and the like. Both the first dielectric layer 8 and the second dielectric layer 9 herein may play a tunneling and passivation function Optionally, referring to FIG. 6, a surface of the first dielectric layer 8 proximate to the silicon substrate 1 is farther away from the second side of the silicon substrate 1 than a surface of the N-type doped polysilicon layer 3 facing away from the silicon substrate 1 is, and a height difference H3 between the surface of the first dielectric layer 8 proximate to the silicon substrate 1 and the surface of the N-type doped polysilicon layer 3 facing away from the silicon substrate 1 is greater than 0 and less than or equal to 4.85 micrometers. Optionally, a surface of the first dielectric layer 8 proximate to the silicon substrate 1 and a surface of the N-type doped polysilicon layer 3 facing away from the silicon substrate 1 are distributed flush with each other. The flush herein is that: a height difference between the surface of the first dielectric layer 8 proximate to the silicon substrate 1 and the surface of the N-type doped polysilicon layer 3 facing away from the silicon substrate 1 is 0. Optionally, referring to FIG. 7, a surface of the first dielectric layer 8 proximate to the silicon substrate 1 is closer to the second side of the silicon substrate 1 than a surface of the N-type doped polysilicon layer 3 facing away from the silicon substrate 1 is, and a height difference H4 between the surface of the first dielectric layer 8 proximate to the silicon substrate 1 and the surface of the N-type doped polysilicon layer 3 facing away from the silicon substrate 1 is greater than 0 and less than or equal to 0.3 micrometers. When a relative position relationship between the surface of the first dielectric layer 8 proximate to the silicon substrate 1 and the surface of the N-type doped polysilicon layer 3 facing away from the silicon substrate 1 is one of the foregoing three cases, the following beneficial technical effects can be achieved: the first dielectric layer 8 or the N-type doped polysilicon layer 3 can play a specific position reference function, which can reduce process difficulty; before the latter doped polysilicon layer is prepared, a part that needs to be etched in the former prepared doped polysilicon layer is etched cleanly, and the P-type doped polysilicon layer 2 and the N-type doped polysilicon layer 3 in a gap between the first region and the second region are both etched cleanly, thereby bringing good electrical performance, a good electrical isolation effect, and a low short-circuit or current leakage risk; and the silicon substrate 1 is not over-etched, and the back contact solar cell is not easily cracked, so that mechanical performance is good.

For example, referring to FIG. 6 and FIG. 7, the surface of the first dielectric layer 8 proximate to the silicon substrate 1 is a lower surface of the first dielectric layer 8, and the surface of the N-type doped polysilicon layer 3 facing away from the silicon substrate 1 is an upper surface of the N-type doped polysilicon layer 3. The second side of the silicon substrate 1 is a lower side of the silicon substrate 1. In FIG. 6, the lower surface of the first dielectric layer 8 is higher than the upper surface of the N-type doped polysilicon layer 3, that is, the surface of the first dielectric layer 8 proximate to the silicon substrate 1 is farther away from the second side of the silicon substrate 1 than the surface of the N-type doped polysilicon layer 3 facing away from the silicon substrate 1 is. In FIG. 6, the height difference H3 between the lower surface of the first dielectric layer 8 and the upper surface of the N-type doped poly silicon layer 3 may be any value in a set (0, 4.85 μm]. For example, in FIG. 6, the height difference H3 between the lower surface of the first dielectric layer 8 and the upper surface of the N-type doped polysilicon layer 3 may be 0.02 μm, 0.05 μm, 0.072 μm, 0.1 μm, 0.42 μm, 0.92 μm, 1.02 μm, 1.46 μm, 1.57 μm, 1.84 μm, 1.95 μm, 2.03 μm, 2.21 μm, 2.37 μm, 2.42 μm, 2.64 μm, 2.97 μm, 3.11 μm, 3.53 μm, 3.69 μm, 3.92 μm, 4.07 μm, 4.26 μm, 4.37 μm, 4.62 μm, or 4.85 μm.

In FIG. 7, the lower surface of the first dielectric layer 8 is lower than the upper surface of the N-type doped polysilicon layer 3, that is, the surface of the first dielectric layer 8 proximate to the silicon substrate 1 is closer to the second side of the silicon substrate 1 than the surface of the N-type doped polysilicon layer 3 facing away from the silicon substrate 1 is. In FIG. 7, the height difference H4 between the lower surface of the first dielectric layer 8 and the upper surface of the N-type doped polysilicon layer 3 may be any value in a set (0, 0.3 μm]. For example, in FIG. 7, the height difference H4 between the lower surface of the first dielectric layer 8 and the upper surface of the N-type doped polysilicon layer 3 may be 0.01 μm, 0.02 μm, 0.04 μm, 0.07 μm, 0.09 μm, 0.1 μm, 0.12 μm, 0.15 μm, 0.16 μm, 0.17 μm, 0.19 μm, 0.2 μm, 0.21 μm, 0.24 μm, 0.246 μm, 0.251 μm, 0.253 μm, 0.261 μm, 0.273 μm, 0.281 μm, 0.287 μm, 0.290 μm, 0.293 μm, 0.296 μm, or 0.3 μm.

Optionally, referring to FIG. 6, the surface of the first dielectric layer 8 proximate to the silicon substrate 1 is farther away from the second side of the silicon substrate 1 than the surface of the N-type doped polysilicon layer 3 facing away from the silicon substrate 1 is, and the height difference H3 between the surface of the first dielectric layer 8 proximate to the silicon substrate 1 and the surface of the N-type doped polysilicon layer 3 facing away from the silicon substrate 1 is greater than 0 and less than or equal to 1.6 micrometers. Through the setting, control over relative positions of the two surfaces is more accurate, a position reference function is more accurate, before the latter doped polysilicon layer is prepared, the part that needs to be etched in the former prepared doped polysilicon layer is etched more cleanly, and the P-type doped polysilicon layer 2 and the N-type doped polysilicon layer 3 in the gap between the first region and the second region are etched more cleanly, thereby bringing better electrical performance, a good electrical isolation effect, and a lower short-circuit or current leakage risk. In addition, the back contact solar cell is less easily cracked, so that mechanical performance is better.

For example, referring to FIG. 6, the lower surface of the first dielectric layer 8 is higher than the upper surface of the N-type doped polysilicon layer 3, that is, the surface of the first dielectric layer 8 proximate to the silicon substrate 1 is farther away from the second side of the silicon substrate 1 than the surface of the N-type doped polysilicon layer 3 facing away from the silicon substrate 1 is. In FIG. 6, the height difference H3 between the lower surface of the first dielectric layer 8 and the upper surface of the N-type doped polysilicon layer 3 may be any value in a set (0, 1.6 μm]. For example, in FIG. 6, the height difference H3 between the lower surface of the first dielectric layer 8 and the upper surface of the N-type doped polysilicon layer 3 may be 0.01 μm, 0.02 μm, 0.05 μm, 0.09 μm, 0.1 μm, 0.12 μm, 0.23 μm, 0.46 μm, 0.57 μm, 0.8 μm, 0.84 μm, 0.95 μm, 1.03 μm, 1.13 μm, 1.21 μm, 1.37 μm, 1.40 μm, 1.42 μm, 1.51 μm, or 1.6 μm.

This application further provides a photovoltaic module, including one or more back contact solar cells described in any of the foregoing embodiments. The photovoltaic module further includes encapsulating films located on two opposite sides of the back contact solar cell. A specific structure of the photovoltaic module is not limited.

It should be noted that, the photovoltaic module and the back contact solar cell have same or similar beneficial effects, and cross reference may be made for related parts of the photovoltaic module and the back contact solar cell. To avoid repetition, details are not described herein.

This application is further described below with reference to specific embodiments. It should be noted that, a pitch involved in the following context is equal to a sum of the width d9 of the P-type collector region 21, the width d8 of the N-type collector region 31, and two times of the dimension d6 of the first gap in the first direction L3.

Embodiment 1

Referring to FIG. 1, the silicon substrate 1 is an N-type silicon substrate, the surface of the second side of the silicon substrate 1 has the textured structure 11, and the front passivation and anti-reflection film layer 6 is further arranged on the surface of the second side of the silicon substrate 1. The P-type doped polysilicon layer 2 is arranged in the first region on the first side of the silicon substrate 1, the N-type doped polysilicon layer 3 is arranged in the second region on the first side, and a gap exists between the first region and the second region. The back composite passivation film layer 7 covers the P-type doped polysilicon layer 2, the N-type doped polysilicon layer 3, and the gap. By using effective process means such as mask preparation and laser film opening, the P-type collector region 21, the P-type bus region 22, the N-type collector region 31, the N-type bus region 32, and the gap are enabled to reach the following sizes and ratios through mask patterning line width and line length control and laser film opening line width and line length control.

Referring to FIG. 2 and FIG. 3, the ratio of the width d8 of an N-type collector region 31 to the width d9 of a P-type collector region 21 ranges from 0.5 to 1.5. The width d8 of an N-type collector region 31 ranges from 380 μm to 500 μm, and the width d9 of a P-type collector region 21 ranges from 300 μm to 450 μm. In the first direction L3, a first gap exists between an N-type collector region 31 and a P-type collector region 21 adjacent to the N-type collector region, and the dimension d6 of a first gap in the first direction L3 ranges from 50 μm 150 μm.

The ratio of the width d4 of an N-type bus region 32 to the width d5 of a P-type bus region 22 is about 1. The width d4 of an N-type bus region 32 and the width d5 of a P-type bus region 22 both range from 300 μm to 800 μm. The ratio of the length of a collector region to the width of a bus region ranges from 22 to 64. The collector region herein is the P-type collector region 21 or the N-type collector region 31, and the bus region herein is the N-type bus region 32 or the P-type bus region 22. A second gap exists between a collector region and a bus region of a different type from that of the collector region in the second direction L4, and the dimension d7 of a second gap in the second direction L4 ranges from 50 μm to 200 μm. The ratio of the length of a collector grid line to the width of a bus grid line ranges from 22 to 64. The collector grid line herein is the P-type collector grid line 41 or the N-type collector grid line 51, and the bus grid line herein is the P-type bus grid line 42 or the N-type bus grid line 52. The direction of the length of a collector grid line and the direction of the width of a bus grid line are both parallel to the second direction L4. The ratio of the volume of a P-type collector region 21 to the volume of an N-type collector region 31 ranges from 0.5 to 4.

Referring to FIG. 1, the ratio of the thickness d1 of the P-type doped polysilicon layer 2 to the thickness d2 of the N-type doped polysilicon layer 3 ranges from 1 to 2. The thickness d1 of the P-type doped polysilicon layer 2 ranges from 100 nm to 500 nm. The thickness d2 of the N-type doped polysilicon layer 3 ranges from 50 nm to 300 nm.

A method for preparing a back contact solar cell corresponding to Embodiment 1 is approximately as follows.

S1: An N-type monocrystalline silicon wafer is selected, and double-sided polishing processing is performed on the N-type monocrystalline silicon wafer to remove a damaged layer, to obtain an N-type silicon substrate.

S2: Tunneling oxide layer preparation and polysilicon layer preparation are performed on a first region on a first side surface of the N-type silicon substrate, where a thickness of the oxide layer ranges from 1 nm to 3 nm, and a thickness of the polysilicon layer ranges from 100 nm to 500 nm.

S3: Boron deposition and diffusion are performed on the polysilicon layer to form a P-type doped polysilicon layer 2.

S4: A barrier layer is designed or laser film opening is performed, where through the design of the barrier layer, the width d9 of a P-type collector region 21 is designed to range from 300 μm to 450 μm (or the width is designed to range from 550 μm to 700 μm through laser film opening) (the width herein is designed based on that a pitch between regions of the same type is 1000 μm), the length of the collector region ranges from 18.3 mm to 19.1 mm (or the length ranges from 18.7 mm to 19.2 mm through laser film opening), and through the design of the barrier layer, the width of the bus region ranges from 300 μm to 800 μm (or the width of the bus region ranges from 400 μm to 1200 μm through laser film opening), and corrosion is then performed at intervals through alkali etching, to remove the P-type doped polysilicon layer 2 to the silicon substrate through etching with an etching depth ranging from 0.1 μm to 5 μm, to form a structure in which high-layers and middle-layers are adjacent to each other and arranged at intervals.

S5: Tunneling oxide layer preparation and polysilicon layer preparation in N-type regions are performed on the first side surface of the silicon substrate 1 and a first side surface of the remaining P-type doped polysilicon layer 2, where a thickness of the oxide layer ranges from 1 nm to 3 nm, and a thickness of the polysilicon layer ranges from 50 nm to 300 nm.

S6: Phosphorous deposition and diffusion are performed on the polysilicon layer obtained through step S5 to form an N-type doped polysilicon layer 3.

S7: After step S6, printing corrosion or laser film opening is performed on the P-type doped polysilicon layer 2 retained after step S4, where a corroded width or a laser film opening width of the collector grid line ranges from 400 μm to 750 μm, and a corroded width or a laser film opening width of the bus grid line ranges from 400 μm to 1200 μm.

S8: Acid etching is performed on a second side surface of the N-type silicon substrate after step S7, and alkali texturing is then performed, to form a textured structure 11 with a light trapping effect on a front surface, where the textured structure 11 may include a pyramid structure, and to form a structure in which high-layer, low-layer, and middle-layer regions are distributed in a staggered manner on a back surface, so as to isolate the P-type doped polysilicon layer 2 from the N-type doped polysilicon layer 3, where the dimension d6 of the first gap in the first direction L3 ranges from 50 μm to 150 μm, the dimension d7 of the second gap in the second direction L4 ranges from 50 μm to 200 μm, and an etching depth ranges from 0.05 μm to 5 μm (compared with a middle-layer N-type doped polysilicon layer 3).

S9: Passivation is performed on the structure obtained through step S8, where a plurality of layers of front passivation and anti-reflection film layers 6 cover the front surface, and a plurality of layers of passivation films cover the back surface to form a back composite passivation film layer 7 on the back surface.

S10: Electrodes are printed on the back composite passivation film layer 7 at intervals, to respectively form positive electrodes 4 and negative electrodes 5 on the P-type doped polysilicon layer 2 and the N-type doped polysilicon layer 3 and form low-layer gap regions between the high-layer regions and the middle-layer regions on the back surface.

In Embodiment 1, both the first dielectric layer 8 and the second dielectric layer 9 are tunneling oxide layers. In Embodiment 1, the surface of the first dielectric layer 8 proximate to the silicon substrate 1 is farther away from the second side of the silicon substrate 1 than the surface of the N-type doped polysilicon layer 3 facing away from the silicon substrate 1 is. This embodiment corresponds to FIG. 6, and the height difference H3 between the surface of the first dielectric layer 8 proximate to the silicon substrate 1 and the surface of the N-type doped polysilicon layer 3 facing away from the silicon substrate 1 is greater than 0 and less than or equal to 4.85 μm. According to Embodiment 1, a current leakage risk can be greatly reduced while a passivation effect and electrical performance are ensured, and the sizes are properly designed, so that the mechanical performance of the solar cell is improved, and the conversion efficiency of the solar cell is improved.

Embodiment 2

Differences between Embodiment 2 and Embodiment 1 only lie in that the etching depth in step S4 ranges from 0.5 μm to 2 μm, and the etching depth in step S8 ranges from 0.5 μm to 3 μm. Remaining steps of Embodiment 2 are the same as corresponding steps in Embodiment 1.

In Embodiment 2, both the first dielectric layer 8 and the second dielectric layer 9 are tunneling oxide layers. In Embodiment 2, the surface of the first dielectric layer 8 proximate to the silicon substrate 1 is farther away from the second side of the silicon substrate 1 than the surface of the N-type doped polysilicon layer 3 facing away from the silicon substrate 1 is. This embodiment corresponds to FIG. 6, and the height difference H3 between the surface of the first dielectric layer 8 proximate to the silicon substrate 1 and the surface of the N-type doped polysilicon layer 3 facing away from the silicon substrate 1 is greater than 0 and less than or equal to 1.6 μm. According to Embodiment 2, a current leakage risk can also be greatly reduced while a passivation effect and electrical performance are ensured, and the sizes are properly designed, so that the conversion efficiency of the solar cell is improved. In addition, compared with Embodiment 1, Embodiment 2 has better electrical performance, a good electrical isolation effect, and a lower short-circuit or current leakage risk. In addition, the back contact solar cell is less easily cracked, so that the mechanical performance is better.

Embodiment 3

Referring to FIG. 1, the silicon substrate 1 is a P-type silicon substrate, the surface of the second side of the silicon substrate 1 has the textured structure 11, and the front passivation and anti-reflection film layer 6 is further arranged on the surface of the second side of the silicon substrate 1. The P-type doped polysilicon layer 2 is arranged in the first region on the first side of the silicon substrate 1, the N-type doped polysilicon layer 3 is arranged in the second region on the first side, and a gap exists between the first region and the second region. The back composite passivation film layer 7 covers the P-type doped polysilicon layer 2, the N-type doped polysilicon layer 3, and the gap. By using effective process means such as mask preparation and laser film opening, the P-type collector region 21, the P-type bus region 22, the N-type collector region 31, the N-type bus region 32, and the gap are enabled to reach the following sizes and ratios through mask patterning line width and line length control and laser film opening line width and line length control.

Referring to FIG. 2 and FIG. 3, the ratio of the width d8 of an N-type collector region 31 to the width d9 of a P-type collector region 21 ranges from 2.5 to 8. The width d8 of an N-type collector region 31 ranges from 500 μm to 800 μm, and the width d9 of a P-type collector region 21 ranges from 100 μm to 200 μm. In the first direction L3, a first gap exists between an N-type collector region 31 and a P-type collector region 21 adjacent to the N-type collector region, and the dimension d6 of the first gap in the first direction L3 ranges from 50 μm 150 μm.

The ratio of the width d4 of an N-type bus region 32 to the width d5 of a P-type bus region 22 is about 1. The width d4 of an N-type bus region 32 and the width d5 of a P-type bus region 22 both range from 300 μm to 800 μm. The ratio of the length of a collector region to the width of a bus region ranges from 22 to 64. The collector region herein is the P-type collector region 21 or the N-type collector region 31, and the bus region herein is the N-type bus region 32 or the P-type bus region 22. A second gap exists between a collector region and a bus region of a different type from that of the collector region in the second direction L4, and the dimension d7 of the second gap in the second direction L4 ranges from 50 μm to 200 μm. The ratio of the length of a collector grid line to the width of a bus grid line ranges from 22 to 64. The collector grid line herein is the P-type collector grid line 41 or the N-type collector grid line 51, and the bus grid line herein is the P-type bus grid line 42 or the N-type bus grid line 52. The direction of the length of a collector grid line and the direction of the width of a bus grid line are both parallel to the second direction L4. The ratio of the volume of a P-type collector region 21 to the volume of an N-type collector region 31 ranges from 0.1 to 0.8.

Referring to FIG. 1, the ratio of the thickness d1 of the P-type doped polysilicon layer 2 to the thickness d2 of the N-type doped polysilicon layer 3 ranges from 1 to 2. The thickness d1 of the P-type doped polysilicon layer 2 ranges from 100 nm to 500 nm. The thickness d2 of the N-type doped polysilicon layer 3 ranges from 50 nm to 300 nm.

A method for preparing a back contact solar cell corresponding to Embodiment 3 is approximately as follows.

S1: A P-type monocrystalline silicon wafer is selected, and double-sided polishing processing is performed on the P-type monocrystalline silicon wafer to remove a damaged layer, to obtain a P-type silicon substrate.

S2: Tunneling oxide layer preparation and poly silicon layer preparation are performed on a first region on a first side surface of the P-type silicon substrate, where a thickness of the oxide layer ranges from 1 nm to 3 nm, and a thickness of the polysilicon layer ranges from 100 nm to 500 nm.

S3: Boron deposition and diffusion are performed on the polysilicon layer to form a P-type doped polysilicon layer 2.

S4: A barrier layer is designed or laser film opening is performed, where through the design of the barrier layer, the width d9 of a P-type collector region 21 is designed to range from 100 μm to 200 μm (or the width is designed to range from 800 μm to 900 μm through laser film opening) (the width herein is designed based on that a pitch between regions of the same type is 1000 μm), the length of the collector region ranges from 18.3 mm to 19.1 mm (or the length ranges from 18.7 mm to 19.2 mm through laser film opening), and through the design of the barrier layer, the width of the bus region ranges from 300 μm to 800 μm (or the width of the bus region ranges from 400 μm to 1200 μm through laser film opening), and corrosion is then performed at intervals through alkali etching, to remove the P-type doped polysilicon layer 2 to the silicon substrate through etching with an etching depth ranging from 0.1

μm to 5 μm, to form a structure in which high-layers and middle-layers are adjacent to each other and arranged at intervals.

S5: Tunneling oxide layer preparation and polysilicon layer preparation in N-type regions are performed on the first side surface of the silicon substrate 1 and a first side surface of the remaining P-type doped polysilicon layer 2, where a thickness of the oxide layer ranges from 1 nm to 3 nm, and a thickness of the polysilicon layer ranges from 50 nm to 300 nm.

S6: Phosphorous deposition and diffusion are performed on the polysilicon layer obtained through step S5 to form an N-type doped polysilicon layer 3.

S7: After step S6, printing corrosion or laser film opening is performed on the P-type doped polysilicon layer 2 retained after step S4, where a corroded width or a laser film opening width of the collector grid line ranges from 200 μm to 500 μm, and a corroded width or a laser film opening width of the bus grid line ranges from 400 μm to 1200 μm.

S8: Acid etching is performed on a second side surface of the N-type silicon substrate 1 after step S7, and alkali texturing is then performed, to form a textured structure 11 with a light trapping effect on a front surface, where the textured structure 11 may include a pyramid structure, and to form a structure in which high-layer, low-layer, and middle-layer regions are distributed in a staggered manner on a back surface, so as to isolate the P-type doped polysilicon layer 2 from the N-type doped polysilicon layer 3, where the dimension d6 of the first gap in the first direction L3 ranges from 50 μm to 150 μm, the dimension d7 of the second gap in the second direction L4 ranges from 50 μm to 200 μm, and an etching depth ranges from 0.05 μm to 5 μm (compared with a middle-layer N-type doped polysilicon layer 3).

S9: Passivation is performed on the structure obtained through step S8, where a plurality of layers of front passivation and anti-reflection film layers 6 cover the front surface, and a plurality of layers of passivation films cover the back surface to form a back composite passivation film layer 7 on the back surface.

S10: Electrodes are printed on the back composite passivation film layer 7 at intervals, to respectively form positive electrodes 4 and negative electrodes 5 on the P-type doped polysilicon layer 2 and the N-type doped polysilicon layer 3 and form low-layer gap regions between the high-layer regions and the middle-layer regions on the back surface.

In Embodiment 3, both the first dielectric layer 8 and the second dielectric layer 9 are tunneling oxide layers. In Embodiment 3, the surface of the first dielectric layer 8 proximate to the silicon substrate 1 is farther away from the second side of the silicon substrate 1 than the surface of the N-type doped polysilicon layer 3 facing away from the silicon substrate 1 is. This embodiment corresponds to FIG. 6, and the height difference H3 between the surface of the first dielectric layer 8 proximate to the silicon substrate 1 and the surface of the N-type doped polysilicon layer 3 facing away from the silicon substrate 1 is greater than 0 and less than or equal to 4.85 μm. According to Embodiment 3, a current leakage risk can be greatly reduced while a passivation effect and electrical performance are ensured, and the sizes are properly designed, so that the mechanical performance of the solar cell is improved, and the conversion efficiency of the solar cell is improved.

Embodiment 4

Differences between Embodiment 4 and Embodiment 3 only lie in that the etching depth in step S4 ranges from 0.5 μm to 2 μm, and the etching depth in step S8 ranges from 0.5 μm to 3 μm. Remaining steps of Embodiment 4 are the same as corresponding steps in Embodiment 3.

In Embodiment 4, both the first dielectric layer 8 and the second dielectric layer 9 are tunneling oxide layers. In Embodiment 4, the surface of the first dielectric layer 8 proximate to the silicon substrate 1 is farther away from the second side of the silicon substrate 1 than the surface of the N-type doped polysilicon layer 3 facing away from the silicon substrate 1 is. This embodiment corresponds to FIG. 6, and the height difference H3 between the surface of the first dielectric layer 8 proximate to the silicon substrate 1 and the surface of the N-type doped polysilicon layer 3 facing away from the silicon substrate 1 is greater than 0 and less than or equal to 1.6 μm. According to Embodiment 4, a current leakage risk can also be greatly reduced while a passivation effect and electrical performance are ensured, and the sizes are properly designed, so that the conversion efficiency of the solar cell is improved. In addition, compared with Embodiment 3, Embodiment 4 has better electrical performance, a good electrical isolation effect, and a lower short-circuit or current leakage risk. In addition, the back contact solar cell is less easily cracked, so that the mechanical performance is better.

It should be noted that, for ease of description, the foregoing method embodiments are represented as a series of action combinations, but a person skilled in the art should know that the embodiments of this application are not limited to the described order of the actions because some steps may be performed in another order or performed simultaneously according to the embodiments of this application. In addition, a person skilled in the art should also know that the embodiments described in this specification are all preferred embodiments, and the actions involved are not necessarily required by the embodiments of this application.

It should be noted that, the terms "include", "comprise", or any other variants thereof in this specification are intended to cover non-exclusive inclusion, so that a process, a method, an object, or a device that includes a series of elements not only includes such elements, but also includes other elements not explicitly listed, or may further include inherent elements of the process, the method, the object, or the device. Without more limitations, an element defined by the statement "including a . . . " does not exclude existence of other same elements in the process, the method, the object, or the device that includes the element.

The embodiments of this application are described above with reference to the accompanying drawings. However, this application is not limited to the foregoing specific implementations, and the foregoing specific implementations are merely illustrative but not limitative. Under the teaching of this application, a person of ordinary skill in the art may further make many forms without departing from the spirit of this application and the protection scope of the claims, and these forms all fall within the protection scope of this application.

The invention claimed is:

1. A back contact solar cell, comprising:

a silicon substrate, comprising a first side and a second side opposite to the first side;

a P-type doped polysilicon layer, located in a first region on the first side of the silicon substrate; and an N-type doped polysilicon layer, located in a second region on the first side of the silicon substrate, wherein the first region is different from the second region, wherein a thickness of the P-type doped polysilicon layer is greater than a thickness of the N-type doped polysilicon layer, and wherein a ratio of the thickness of the P-type doped polysilicon layer to the thickness of the N-type doped polysilicon layer is smaller than or equal to 2, wherein a surface of the P-type doped polysilicon layer proximate to the silicon substrate is farther away from the second side of the silicon substrate than a surface of the N-type doped polysilicon layer facing away from the silicon substrate is, wherein a height difference between the surface of the P-type doped polysilicon layer proximate to the silicon substrate and the surface of the N-type doped polysilicon layer facing away from the silicon substrate is greater than 0 and less than or equal to 4.85 micrometers, wherein the P-type doped polysilicon layer comprises a plurality of P-type collector regions, and the N-type doped polysilicon layer comprises a plurality of N-type collector regions, wherein the plurality of N-type collector regions and the plurality of P-type collector regions are alternately distributed along a first direction and extend along a second direction, and wherein along the first direction, a first gap exists between a P-type collector region and a N-type collector region adjacent to the P-type collector region.

2. The back contact solar cell according to claim 1, wherein the surface of the P-type doped polysilicon layer proximate to the silicon substrate is farther away from the second side of the silicon substrate than the surface of the N-type doped polysilicon layer facing away from the silicon substrate is, wherein the height difference between the surface of the P-type doped polysilicon layer proximate to the silicon substrate and the surface of the N-type doped polysilicon layer facing away from the silicon substrate is greater than 0 and less than or equal to 1.6 micrometers.

3. The back contact solar cell according to claim 1, wherein the back contact solar cell further comprises:

a first dielectric layer, located between the P-type doped polysilicon layer and the first region on the first side of the silicon substrate.

4. The back contact solar cell according to claim 3, wherein:

a surface of the first dielectric layer proximate to the silicon substrate is farther away from the second side of the silicon substrate than a surface of the N-type doped polysilicon layer facing away from the silicon substrate is, wherein a height difference between the surface of the first dielectric layer proximate to the silicon substrate and the surface of the N-type doped polysilicon layer facing away from the silicon substrate is greater than 0 and less than or equal to 4.85 micrometers; or the surface of the first dielectric layer proximate to the silicon substrate and the surface of the N-type doped polysilicon layer facing away from the silicon substrate are distributed flush with each other.

5. The back contact solar cell according to claim 4, wherein the surface of the first dielectric layer proximate to the silicon substrate is farther away from the second side of the silicon substrate than the surface of the N-type doped polysilicon layer facing away from the silicon substrate is, wherein the height difference between the surface of the first dielectric layer proximate to the silicon substrate and the surface of the N-type doped polysilicon layer facing away from the silicon substrate is greater than 0 and less than or equal to 1.6 micrometers.

6. The back contact solar cell according to claim 1, wherein the silicon substrate is N-type doped, wherein a ratio of a width of an N-type collector region of the plurality of N-type collector regions to a width of a P-type collector region of the plurality of P-type collector regions ranges from 0.5 to 1.5, wherein a direction of the width of the N-type collector region and a direction of the width of the P-type collector region are parallel to the first direction.

7. The back contact solar cell according to claim 1, wherein the silicon substrate is N-type doped, wherein the P-type doped polysilicon layer comprises a plurality of P-type collector regions and the N-type doped polysilicon layer comprises a plurality of N-type collector regions, wherein the plurality of N-type collector regions and the plurality of P-type collector regions are alternately distributed along a first direction and extend along a second direction, and wherein a ratio of a volume of a P-type collector region of the plurality of P-type collector regions to a volume of an N-type collector region of the plurality of N-type collector regions ranges from 0.5 to 4.

8. The back contact solar cell according to claim 1, wherein the silicon substrate is P-type doped, wherein the P-type doped polysilicon layer comprises a plurality of P-type collector regions, and the N-type doped polysilicon layer comprises a plurality of N-type collector regions, wherein the plurality of N-type collector regions and the plurality of P-type collector regions are alternately distributed along a first direction and extend along a second direction, and wherein a volume of a P-type collector region of the plurality of P-type collector regions is smaller than a volume of an N-type collector region of the plurality of N-type collector regions.

9. The back contact solar cell according to claim 8, wherein a ratio of the volume of the P-type collector region to the volume of the N-type collector region ranges from 0.1 to 0.8.

10. The back contact solar cell according to claim 1, wherein the silicon substrate is P-type doped, wherein the P-type doped polysilicon layer comprises a plurality of P-type collector regions, and the N-type doped polysilicon layer comprises a plurality of N-type collector regions, wherein the plurality of N-type collector regions and the plurality of P-type collector regions are alternately distributed along a first direction and extend along a second direction, and wherein a width of an N-type collector region of the plurality of N-type collector regions is greater than a width of a P-type collector region of the plurality of P-type collector regions, wherein a direction of the width of the N-type collector region and a direction of the width of the P-type collector region are parallel to the first direction.

11. The back contact solar cell according to claim 10, wherein a ratio of the width of the N-type collector region to the width of the P-type collector region ranges from 2.5 to 8.

12. The back contact solar cell according claim 1, wherein the P-type doped polysilicon layer comprises a plurality of P-type collector regions and a plurality of P-type bus regions, wherein the N-type doped polysilicon layer comprises a plurality of N-type collector regions and a plurality of N-type bus regions, wherein the N-type collector regions and the P-type collector regions are alternately distributed along a first direction and extend along the second direction, wherein the N-type bus regions and the P-type bus regions are alternately distributed along the second direction and extend along the first direction, wherein the first direction is different from the second direction, and the first direction and the second direction are perpendicular to a thickness direction, wherein each N-type collector region located between an N-type bus region and a P-type bus region adjacent to the N-type bus region is connected to the N-type bus region, wherein each P-type collector region located between an N-type bus region and a P-type bus region adjacent to the N-type bus region is connected to the P-type bus region, and wherein a ratio of a length of a collector region to a width of a bus region ranges from 22 to 64, wherein the collector region is one of the plurality of P-type collector regions or the plurality of N-type collector regions, and the bus region is one of the plurality of P-type bus regions or the plurality of N-type bus regions, where a direction of the length of the collector region and a direction of the width of the bus region are parallel to the second direction.

13. The back contact solar cell according to claim 12, wherein:

a second gap exists between a collector region and a bus region of a different type from that of the collector region; and a dimension of the second gap in the second direction is greater than or equal to a dimension of the first gap in the first direction.

14. The back contact solar cell according to claim 13, wherein a ratio of the dimension of the second gap in the second direction to the dimension of the first gap in the first direction ranges from 1 to 4.

15. The back contact solar cell according to claim 12, wherein a volume of a P-type bus region of the plurality of P-type bus regions is greater than or equal to a volume of an N-type bus region of the plurality of N-type bus regions.

16. The back contact solar cell according to claim 15, wherein a ratio of the volume of the P-type bus region to the volume of the N-type bus region ranges from 1 to 2.

17. The back contact solar cell according to claim 12, wherein:

a ratio of a width of a P-type bus region of the plurality of P-type bus regions to a width of an N-type bus region of the plurality of N-type bus regions ranges from 0.95 to 1.05; or a ratio of a length of a P-type collector region of the plurality of P-type collector regions to a length of an N-type collector region of the plurality of N-type collector regions ranges from 0.95 to 1.05.

18. A photovoltaic module, comprising one or more back contact solar cells, each comprising:

a silicon substrate, comprising a first side and a second side opposite to the first side;

a P-type doped polysilicon layer, located in a first region on the first side of the silicon substrate; and an N-type doped polysilicon layer, located in a second region on the first side of the silicon substrate, wherein the first region is different from the second region, wherein a thickness of the P-type doped polysilicon layer is greater than a thickness of the N-type doped polysilicon layer, and wherein a ratio of the thickness of the P-type doped polysilicon layer to the thickness of the N-type doped polysilicon layer is smaller than or equal to 2, wherein a surface of the P-type doped polysilicon layer proximate to the silicon substrate is farther away from the second side of the silicon substrate than a surface of the N-type doped polysilicon layer facing away from the silicon substrate is, wherein a height difference between the surface of the P-type doped polysilicon layer proximate to the silicon substrate and the surface of the N-type doped polysilicon layer facing away from the silicon substrate is greater than 0 and less than or equal to 4.85 micrometers, wherein the P-type doped polysilicon layer comprises a plurality of P-type collector regions, and the N-type doped polysilicon layer comprises a plurality of N-type collector regions, wherein the plurality of N-type collector regions and the plurality of P-type collector regions are alternately distributed along a first direction and extend along a second direction, and wherein along the first direction, a first gap exists between a P-type collector region and a N-type collector region adjacent to the P-type collector region.

* * * * *